US012793784B2

(12) United States Patent
Takahashi

(10) Patent No.: US 12,793,784 B2
(45) Date of Patent: Nov. 10, 2026

(54) SEMICONDUCTOR MEMORY DEVICE AND METHOD OF CONTROLLING THE SAME

(71) Applicant: Kioxia Corporation, Tokyo (JP)

(72) Inventor: Eietsu Takahashi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 35 days.

(21) Appl. No.: 19/007,039

(22) Filed: Dec. 31, 2024

(65) Prior Publication Data

US 2025/0299741 A1 Sep. 25, 2025

(30) Foreign Application Priority Data

Mar. 21, 2024 (JP) ................................ 2024-044766

(51) Int. Cl.

*G11C 16/10* (2006.01)
*G11C 16/04* (2006.01)
*G11C 16/08* (2006.01)
*G11C 16/24* (2006.01)

(52) U.S. Cl.

CPC ........ *G11C 16/102* (2013.01); *G11C 16/0433* (2013.01); *G11C 16/08* (2013.01); *G11C 16/24* (2013.01); *G11C 16/10* (2013.01)

(58) Field of Classification Search

CPC ............................ G06F 3/03611; G11C 16/10

See application file for complete search history.

(56) References Cited

U.S. PATENT DOCUMENTS

| | | | |
|---|---|---|---|
| 10,978,165 B2 | 4/2021 | Nishikawa et al. | |
| 2006/0018162 A1 | 1/2006 | Kawai | |
| 2016/0064083 A1 | 3/2016 | Nam et al. | |
| 2021/0247910 A1 * | 8/2021 | Kim ...................... | G06F 3/0611 |
| 2022/0139473 A1 | 5/2022 | Kim et al. | |

FOREIGN PATENT DOCUMENTS

| | | |
|---|---|---|
| JP | 2020-9511 A | 1/2020 |

* cited by examiner

*Primary Examiner* — Jason Lappas

(74) *Attorney, Agent, or Firm* — Oblon, McClelland, Maier & Neustadt, L.L.P.

(57) ABSTRACT

A semiconductor memory device comprises memory blocks and a control circuit. The control circuit is configured capable of executing a first pre-charge operation and a first program operation, and uninterruptedly thereafter executing a second program operation, in a first-mode write operation. In the first pre-charge operation, a first word line is applied with a certain voltage. In the first program operation, a first select gate line is applied with a first voltage, the first word line is applied with a first program voltage, and a second word line is applied with a write pass voltage smaller than the first program voltage. In the second program operation, a second select gate line is applied with the first voltage, the first word line is applied with a second program voltage larger than the write pass voltage, and the second word line is applied with the write pass voltage.

20 Claims, 20 Drawing Sheets

SEMICONDUCTOR MEMORY DEVICE AND METHOD OF CONTROLLING THE SAME

CROSS-REFERENCE TO RELATED APPLICATIONS

This application is based upon and claims the benefit of Japanese Patent Application No. 2024-044766, filed on Mar. 21, 2024, the entire contents of which are incorporated herein by reference.

BACKGROUND

Field

The present embodiments relate to semiconductor memory devices and method of controlling the same.

Description of the Related Art

There is known a semiconductor memory device comprising: a substrate; a plurality of memory blocks arranged with the substrate; and a control circuit electrically connected to the plurality of memory blocks.

DETAILED DESCRIPTION

Figure 1:
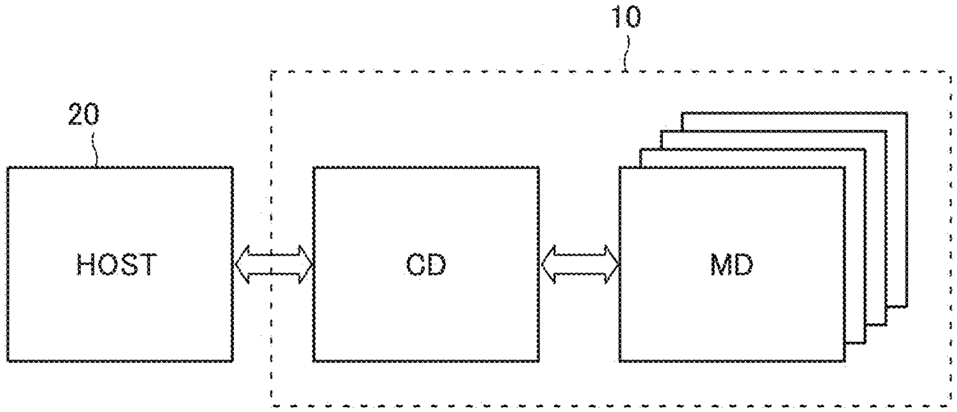
FIG. 1 is a schematic block diagram showing a configuration of a memory system 10.

A semiconductor memory device according to one embodiment comprises: a substrate; a plurality of memory blocks arranged with the substrate in a first direction intersecting a surface of the substrate and arranged in a second direction intersecting the first direction; and a control circuit connected to the plurality of memory blocks, the control circuit executing a write operation. The plurality of memory blocks each comprise: a first drain side select transistor and a second drain side select transistor; a first source side select transistor and a second source side select transistor; a first memory cell transistor and a second memory cell transistor electrically connected in series between the first drain side select transistor and the first source side select transistor; a third memory cell transistor and a fourth memory cell transistor electrically connected in series between the second drain side select transistor and the second source side select transistor; a first bit line and a second bit line respectively electrically connected to the first drain side select transistor and the second drain side select transistor; a first select gate line electrically connected to a gate electrode of the first drain side select transistor; a second select gate line electrically connected to a gate electrode of the second drain side select transistor; a third select gate line electrically connected to gate electrodes of the first source side select transistor and the second source side select transistor; a source line electrically connected to the first source side select transistor and the second source side select transistor; a first word line electrically connected to gate electrodes of the first memory cell transistor and the third memory cell transistor; and a second word line electrically connected to gate electrodes of the second memory cell transistor and the fourth memory cell transistor.

The control circuit is configured capable of executing a first-mode write operation in which the control circuit sequentially executes a first pre-charge operation and a first program operation, and uninterruptedly thereafter executes a second program operation.

The control circuit applies the first word line with a certain voltage in the first pre-charge operation, and applies the first select gate line with a first voltage, applies the second select gate line with a second voltage smaller than the first voltage, applies the first word line with a first program voltage, and applies the second word line with a write pass voltage smaller than the first program voltage, in the first program operation. The control circuit applies the first select gate line with the second voltage, applies the second select gate line with the first voltage, applies the first word line with a second program voltage larger than the write pass voltage, and applies the second word line with the write pass voltage, in the second program operation. Moreover, after apply of the first program voltage and before apply of the second program voltage, the control circuit switches a voltage of the first select gate line from the first voltage to the second voltage, and switches a voltage of the second select gate line from the second voltage to the first voltage.

Next, semiconductor memory devices according to embodiments will be described in detail with reference to the drawings. Note that the following embodiments are merely examples, and are not shown with the intention of limiting the present invention.

Moreover, when a "semiconductor memory device" is referred to in the present specification, it will sometimes mean a memory die (a memory chip), and will sometimes mean a memory system including a controller die, of the likes of a memory card or an SSD. Furthermore, it will sometimes mean a configuration including a host computer, of the likes of a smartphone, a tablet terminal, or a personal computer.

Moreover, when a "control circuit" is referred to in the present specification, it will sometimes mean a peripheral circuit of the likes of a sequencer provided in a memory die, will sometimes mean the likes of a controller die or controller chip connected to the memory die, and will sometimes mean a configuration including both the peripheral circuit and the controller die or controller chip.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even when the second transistor is in an OFF state.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically continuous" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be referred to as an X-direction, a direction parallel to the upper surface of the substrate and perpendicular to the X-direction will be referred to as a Y-direction, and a direction perpendicular to the upper surface of the substrate will be referred to as a Z-direction.

First Embodiment

Memory System 10

FIG. 1 is a schematic block diagram showing a configuration of a memory system 10.

The memory system 10 performs read, write, erase, and so on, of user data, in response to a signal transmitted from a host computer 20. The memory system 10 is a memory chip, a memory card, an SSD, or another system capable of storing user data, for example. The memory system 10 comprises: a plurality of memory dies MD storing user data; and a controller CD connected to these plurality of memory dies MD and to the host computer 20. The controller CD comprises the likes of a processor, a RAM, a ROM, and an ECC circuit, for example, and performs processing, such as conversion of a logical address and a physical address, bit error detection/correction, and wear leveling. Moreover, the controller CD includes a memory region MEM 10 which will be mentioned later.

Configuration of Memory Die MD

Figure 2:
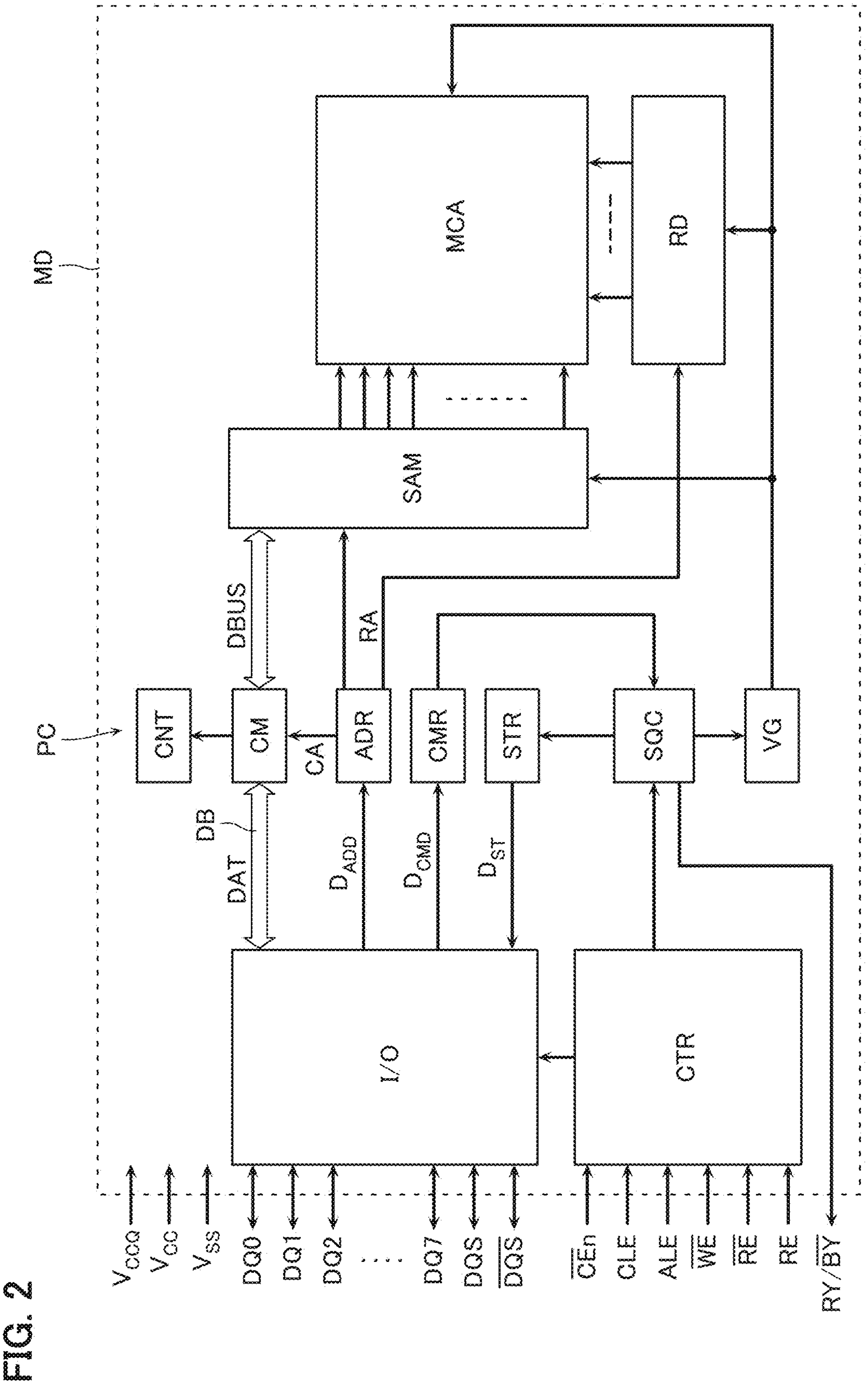
FIG. 2 is a schematic block diagram showing a configuration of a memory die MD.
Figure 3:
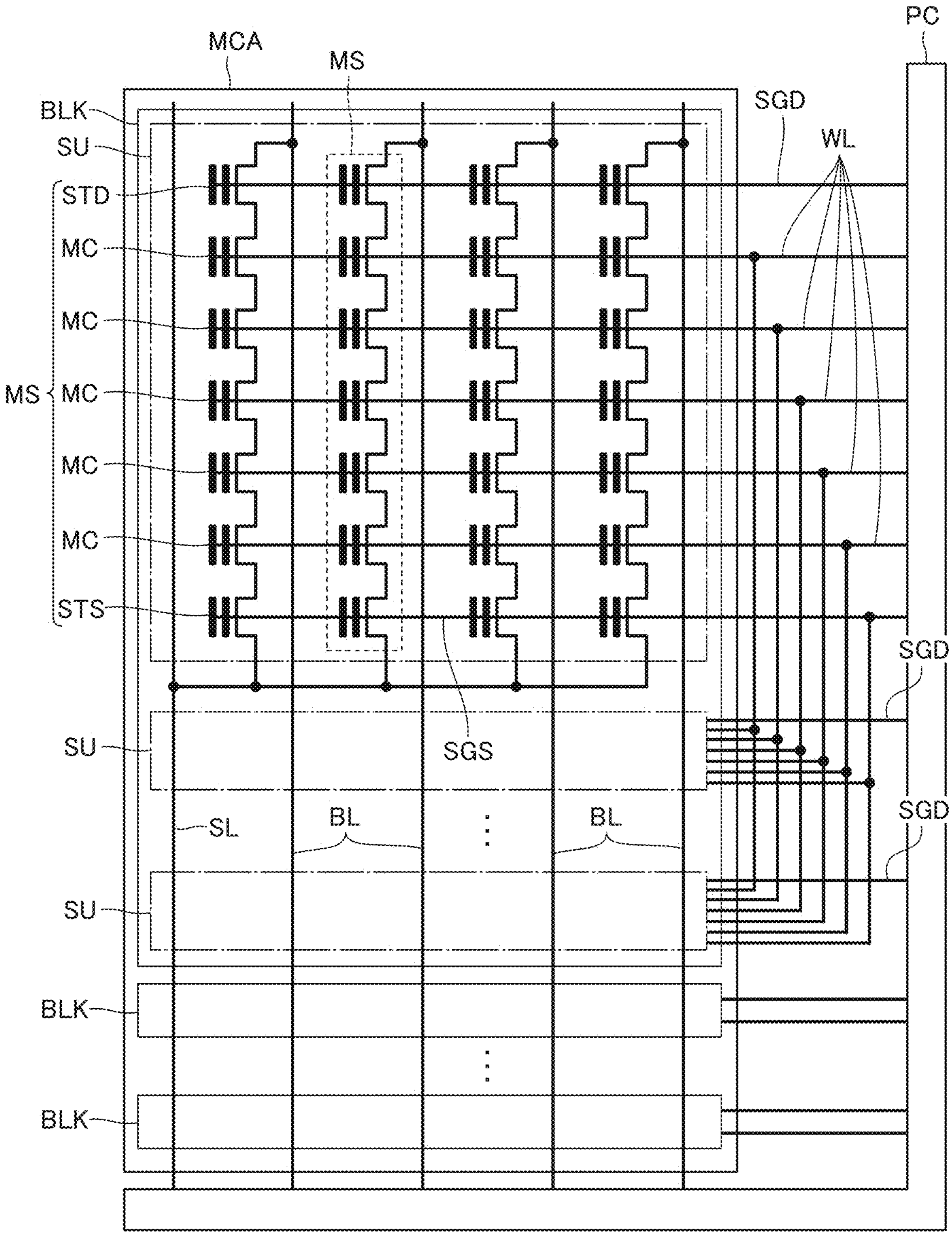
FIG. 3 is a schematic circuit diagram showing a part of the configurations of the memory die MD.
Figure 4:
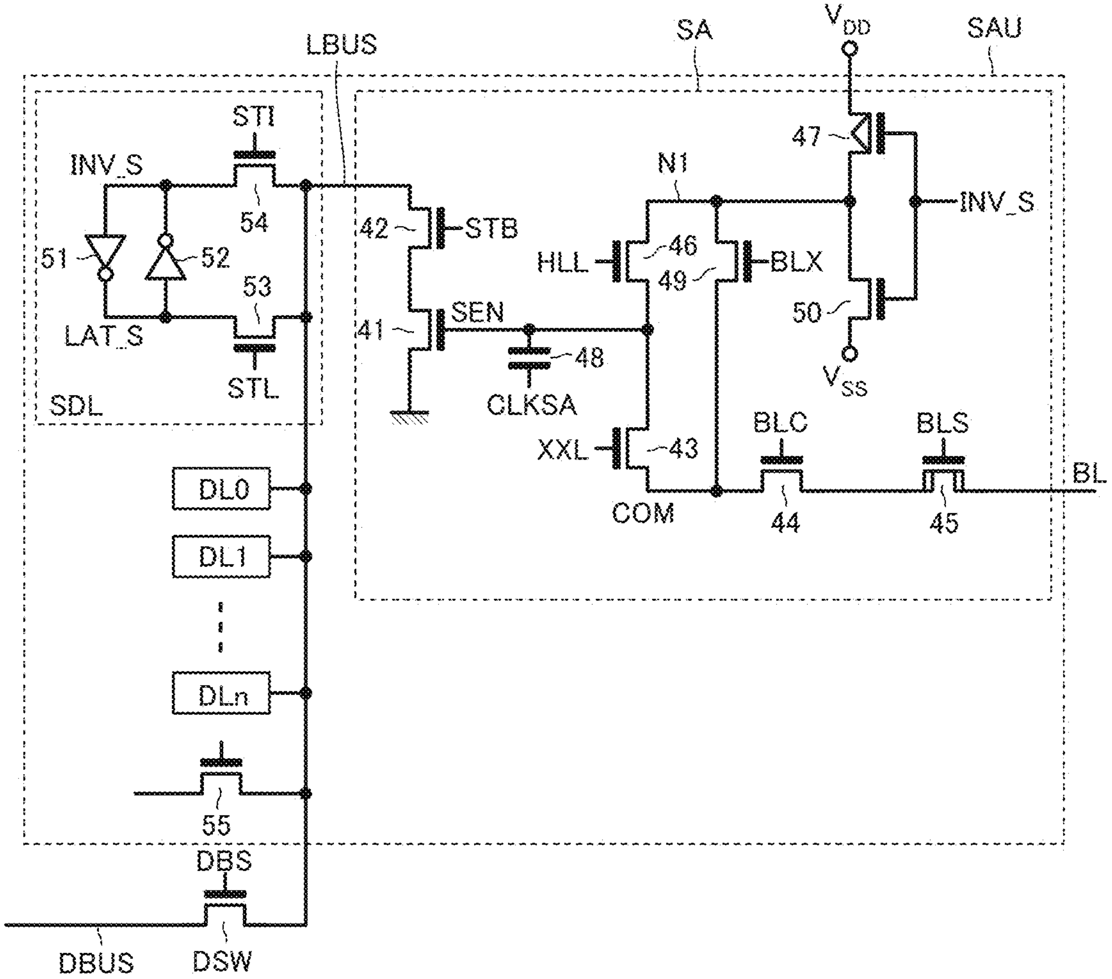
FIG. 4 is a schematic circuit diagram showing a part of the configurations of the memory die MD.

FIG. 2 is a schematic block diagram showing a configuration of the memory die MD. FIGS. 3 and 4 are schematic circuit diagrams showing a part of the configurations of the memory die MD.

Note that in FIG. 2, a plurality of control terminals, and so on, are illustrated. These plurality of control terminals are sometimes indicated as a control terminal corresponding to a high active signal (a positive logic signal), sometimes indicated as a control terminal corresponding to a low active signal (a negative logic signal), and sometimes indicated as a control terminal corresponding to both a high active signal and a low active signal. In FIG. 2, a symbol of a control terminal corresponding to a low active signal includes an overline. In the present specification, a symbol of a control terminal corresponding to a low active signal includes a slash ("/").

Note that description of FIG. 2 is an exemplification, and that a specific mode is appropriately adjustable. For example, it is possible too for some or all of the high active signals to be configured as low active signals, or for some or all of the low active signals to be configured as high active signals. Moreover, a later-mentioned terminal RY/(/BY) is a terminal that outputs a ready signal as a high active signal and a busy signal as a low active signal. The slash ("/") between RY and (/BY) is to indicate demarcation of the ready signal and the busy signal.

As shown in FIG. 2, the memory die MD comprises: a memory cell array MCA that stores data; and a peripheral circuit PC which is connected to the memory cell array MCA.

Circuit Configuration of Memory Cell Array MCA

As shown in FIG. 3, the memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory cell transistors), and a source side select transistor STS that are connected in series between the bit line BL and the source line SL. Hereafter, the drain side select transistor STD and the source side select transistor STS will sometimes simply be referred to as select transistors (STD, STS).

The memory cell MC is a field effect type transistor (a memory transistor) comprising a semiconductor layer, a gate insulating film, and a gate electrode. The semiconductor layer functions as a channel region. The gate insulating film includes an electric charge accumulating film. A threshold voltage of the memory cell MC changes according to an amount of charge in the electric charge accumulating film. The memory cell MC stores 1-bit or a plurality of bits of data. The memory cell MC stores data as magnitude of the threshold voltage. Note that the gate electrodes of the plurality of memory cells MC corresponding to one memory string MS are respectively connected with word lines WL. These word lines WL are respectively commonly connected to all of the memory strings MS in one memory block BLK.

The select transistors (STD, STS) are field effect type transistors each comprising a semiconductor layer, a gate insulating film, and a gate electrode. The semiconductor layer functions as a channel region. The gate electrode of the drain side select transistor STD is connected with a drain side select gate line SGD. The gate electrode of the source side select transistor STS is connected with a source side select gate line SGS. The drain side select gate line SGD, which is provided correspondingly to the string unit SU, is commonly connected to all of the memory strings MS in one string unit SU. The source side select gate line SGS is commonly connected to all of the memory strings MS in the memory block BLK. Hereafter, the drain side select gate line SGD and the source side select gate line SGS will sometimes simply be referred to as select gate lines (SGD, SGS).

Circuit Configuration of Peripheral Circuit PC

As shown in FIG. 2, the peripheral circuit PC comprises a row decoder RD, a sense amplifier module SAM, a cache memory CM, a counter CNT, a voltage generating circuit VG, and a sequencer SQC. In addition, the peripheral circuit PC comprises an address register ADR, a command register CMR, and a status register STR. Moreover, the peripheral circuit PC comprises an input/output control circuit I/O and a logic circuit CTR.

Configuration of Row Decoder RD

The row decoder RD (FIG. 2) comprises an address decoder that decodes a row address RA in address data $D_{ADD}$. Moreover, the row decoder RD (FIG. 2) comprises a block select circuit and a voltage select circuit that transfer an operation voltage to the memory cell array MCA depending on an output signal of the address decoder.

Configuration of Sense Amplifier Module SAM

The sense amplifier module SAM comprises a plurality of sense amplifier units SAU (FIG. 4) which are provided correspondingly to a plurality of the bit lines BL, for example. As shown in FIG. 4, the sense amplifier unit SAU comprises a sense amplifier SA, a wiring LBUS, and latch circuits SDL, DL0 to DLn (where n is a natural number). The wiring LBUS is connected with a pre-charge charge transistor 55 (FIG. 4). The wiring LBUS is connected to a wiring DBUS via a switch transistor DSW.

The sense amplifier SA comprises a sense transistor 41. The sense transistor 41 discharges a charge of the wiring LBUS depending on a current flowing in the bit line BL. A source electrode of the sense transistor 41 is connected to a voltage supply line applied with a voltage $V_{SS}$ (a ground voltage). A drain electrode of the sense transistor 41 is connected to the wiring LBUS via a switch transistor 42. A gate electrode of the sense transistor 41 is electrically connected to the bit line BL via a sense node SEN, a discharge transistor 43, a node COM, a clamp transistor 44, and a voltage-withstanding transistor 45. Note that the sense node SEN is connected to an internal control signal line CLKSA via a capacitor 48.

Moreover, the sense amplifier SA comprises a voltage transfer circuit. The voltage transfer circuit selectively causes the node COM and the sense node SEN to be electrically continuous with a voltage supply line applied with a voltage $V_{DD}$ or the voltage supply line applied with the voltage $V_{SS}$, depending on data held in the latch circuit SDL. The voltage transfer circuit comprises a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and the voltage supply line applied with the voltage $V_{DD}$. The discharge transistor 50 is connected between the node N1 and the voltage supply line applied with the voltage $V_{SS}$. Note that gate electrodes of the charge transistor 47 and the discharge transistor 50 are commonly connected to a node INV_S of the latch circuit SDL.

Note that the sense transistor 41, the switch transistor 42, the discharge transistor 43, the clamp transistor 44, the charge transistor 46, the charge transistor 49, and the discharge transistor 50 are enhancement type NMOS transistors, for example. The voltage-withstanding transistor 45 is a depletion type NMOS transistor, for example. The charge transistor 47 is a PMOS transistor, for example.

Moreover, a gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the voltage-withstanding transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, BLX are connected to the sequencer SQC (FIG. 2).

The latch circuit SDL comprises a node LAT_S, the node INV_S, an inverter 51, an inverter 52, a switch transistor 53, and a switch transistor 54. The inverter 51 comprises an output terminal connected to the node LAT_S and an input terminal connected to the node INV_S. The inverter 52 comprises an input terminal connected to the node LAT_S and an output terminal connected to the node INV_S. The switch transistor 53 is provided in a current path between the node LAT_S and the wiring LBUS. The switch transistor 54 is provided in a current path between the node INV_S and the wiring LBUS. The switch transistors 53, 54 are NMOS transistors, for example. A gate electrode of the switch transistor 53 is connected to the sequencer SOC via a signal line STL. A gate electrode of the switch transistor 54 is connected to the sequencer SQC via a signal line STI.

Each of a plurality of the latch circuits SDL corresponding to a plurality of the bit lines BL latches 1 bit of data written by a write operation, or the like.

The latch circuits DL0 to DLn are configured substantially similarly to the latch circuit SDL. However, as mentioned above, the node INV_S of the latch circuit SDL is electrically continuous with the gate electrodes of the charge transistor 47 and the discharge transistor 50 in the sense amplifier SA. The latch circuits DL0 to DLn differ from the latch circuit SDL in this respect.

The plurality of latch circuits DL0 to DLn corresponding to a plurality of the bit lines BL each latch 1 bit of data written by a write operation.

The switch transistor DSW is an NMOS transistor, for example. The switch transistor DSW is connected between the wiring LBUS and the wiring DBUS. A gate electrode of the switch transistor DSW is connected to the sequencer SQC via a signal line DBS.

The above-mentioned signal lines STB, HLL, XXL, BLX, BLC, BLS are each commonly connected to all of the sense amplifier units SAU included in the sense amplifier module SAM. Moreover, the above-mentioned voltage supply line applied with the voltage $V_{DD}$ and the voltage supply line applied with the voltage $V_{SS}$ are each commonly connected to all of the sense amplifier units SAU included in the sense amplifier module SAM. Moreover, the signal line STI and the signal line STL of the latch circuit SDL are each commonly connected to all of the sense amplifier units SAU included in the sense amplifier module SAM.

Configuration of Cache Memory CM

The cache memory CM (FIG. 2) comprises a plurality of latch circuits. The plurality of latch circuits within the cache memory CM are connected to the latch circuits within the sense amplifier module SAM via the wiring DBUS. Data DAT included in the plurality of latch circuits within the cache memory CM is sequentially transferred to the sense amplifier module SAM or the input/output control circuit I/O.

Moreover, the cache memory CM is connected with an unillustrated decode circuit and an unillustrated switch circuit. The decode circuit decodes a column address CA held in the address register ADR (FIG. 2). The switch circuit causes the latch circuit corresponding to the column address CA to be electrically continuous with a bus DB (FIG. 2), depending on an output signal of the decode circuit.

Configuration of Counter CNT

The counter CNT (FIG. 2) receives data sequentially transferred from the latch circuits of the cache memory CM. Moreover, the counter CNT counts the number of those bits indicating "0" or "1", of bits included in the data it has received.

Circuit Configuration of Voltage Generating Circuit VG

The voltage generating circuit VG (FIG. 2) includes a step-down circuit and a booster circuit, for example. The step-down circuit is the likes of a regulator, for example. The booster circuit is the likes of a charge pump circuit, for example. These step-down circuit and booster circuit are each connected to a power supply voltage supply line. The voltage generating circuit VG is applied with a power supply voltage $V_{CC}$ and the voltage $V_{SS}$. The voltage generating circuit VG generates a plurality of types of operation voltages, and simultaneously outputs the plurality of types of operation voltages to a plurality of voltage supply lines. These plurality of types of operation voltages are applied to the bit lines BL, the source line SL, the word lines WL, and the select gate lines (SGD, SGS) during a read operation, a write operation, and an erase operation on the memory cell array MCA, for example. The operation voltages are appropriately adjusted according to a control signal from the sequencer SQC.

Configuration of Sequencer SQC

The sequencer SQC (FIG. 2) outputs an internal control signal to the row decoder RD, the sense amplifier module SAM, and the voltage generating circuit VG, according to command data DoD stored in the command register CMR. In addition, the sequencer SQC appropriately outputs to the status register STR status data $D_{ST}$ indicating a state of the memory die MD.

Moreover, the sequencer SQC generates the ready/busy signal, and outputs the ready/busy signal to the terminal RY/(/BY). In a period when the terminal RY/(/BY) is in an "L" state (a busy period), access to the memory die MD is basically prohibited. Moreover, in a period when the terminal RY/(/BY) is in an "H" state (a ready period), access to the memory die MD is allowed.

Configuration of Address Register ADR

As shown in FIG. 2, the address register ADR is connected to the input/output control circuit I/O and stores address data $D_{ADD}$ that has been inputted from the input/output control circuit I/O. The address register ADR comprises a plurality of 8-bit register columns, for example. The register column latches address data $D_{ADD}$ corresponding to an under-execution internal operation such as a read operation, a write operation, or an erase operation, when the internal operation is executed, for example.

Note that the address data $D_{ADD}$ includes the column address CA (FIG. 2) and the row address RA (FIG. 2), for example. The row address RA includes, for example: a block address specifying the memory block BLK (FIG. 3); a page address specifying the string unit SU and the word line WL; a plane address specifying the memory cell array MCA (plane); and a chip address specifying the memory die MD.

Configuration of Command Register CMR

The command register CMR is connected to the input/output control circuit I/O and stores command data Do that has been inputted from the input/output control circuit I/O. The command register CMR comprises at least one set of 8-bit register columns, for example. When command data $D_{CMD}$ is stored in the command register CMR, a control signal is transmitted to the sequencer SQC.

Configuration of Status Register STR

The status register STR is connected to the input/output control circuit I/O and stores status data $D_{ST}$ to be outputted to the input/output control circuit I/O. The status register STR comprises a plurality of 8-bit register columns, for example. The register column latches status data $D_{ST}$ relating to an under-execution internal operation such as a read operation, a write operation, or an erase operation, when the internal operation is executed, for example. Moreover, the register column latches ready/busy information on the memory cell array MCA, for example.

Configuration of Input/Output Control Circuit I/O

The input/output control circuit I/O (FIG. 2) comprises data signal input/output terminals DQ0 to DQ7, data strobe signal input/output terminals DQS, /DQS, a shift register, and a buffer circuit. The input/output control circuit I/O (FIG. 2) is applied with a power supply voltage $V_{CCQ}$.

Data that has been inputted via the data signal input/output terminals DQ0 to DQ7 is outputted to the cache memory CM, the address register ADR, or the command register CMR from the buffer circuit, depending on an internal control signal from the logic circuit CTR. Moreover, data to be outputted via the data signal input/output terminals DQ0 to DQ7 is inputted to the buffer circuit from the cache memory CM or the status register STR, depending on an internal control signal from the logic circuit CTR.

Signals that have been inputted via the data strobe signal input/output terminals DQS, /DQS (for example, a data strobe signal and a complementary signal thereof) are employed during input of data via the data signal input/output terminals DQ0 to DQ7. The data that has been inputted via the data signal input/output terminals DQ0 to DQ7 is imported into the shift register in the input/output control circuit I/O at a timing of a rising edge of voltage (switching of input signal) of the data strobe signal input/output terminal DQS and falling edge of voltage (switching of input signal) of the data strobe signal input/output terminal /DQS and a timing of a falling edge of voltage (switching of input signal) of the data strobe signal input/output terminal DQS and rising edge of voltage (switching of input signal) of the data strobe signal input/output terminal /DQS.

Configuration of Logic Circuit CTR

The logic circuit CTR (FIG. 2) comprises: a plurality of external control terminals /CE, CLE, ALE, /WE, /RE, RE; and a logic circuit connected to these plurality of external control terminals /CE, CLE, ALE, /WE, /RE, RE. The logic circuit CTR receives an external control signal from the controller CD via the external control terminals /CE, CLE, ALE, /WE, /RE, RE, and outputs an internal control signal to the input/output control circuit I/O depending on this external control signal.

Part of Configurations of Memory Die MD

Figure 5:
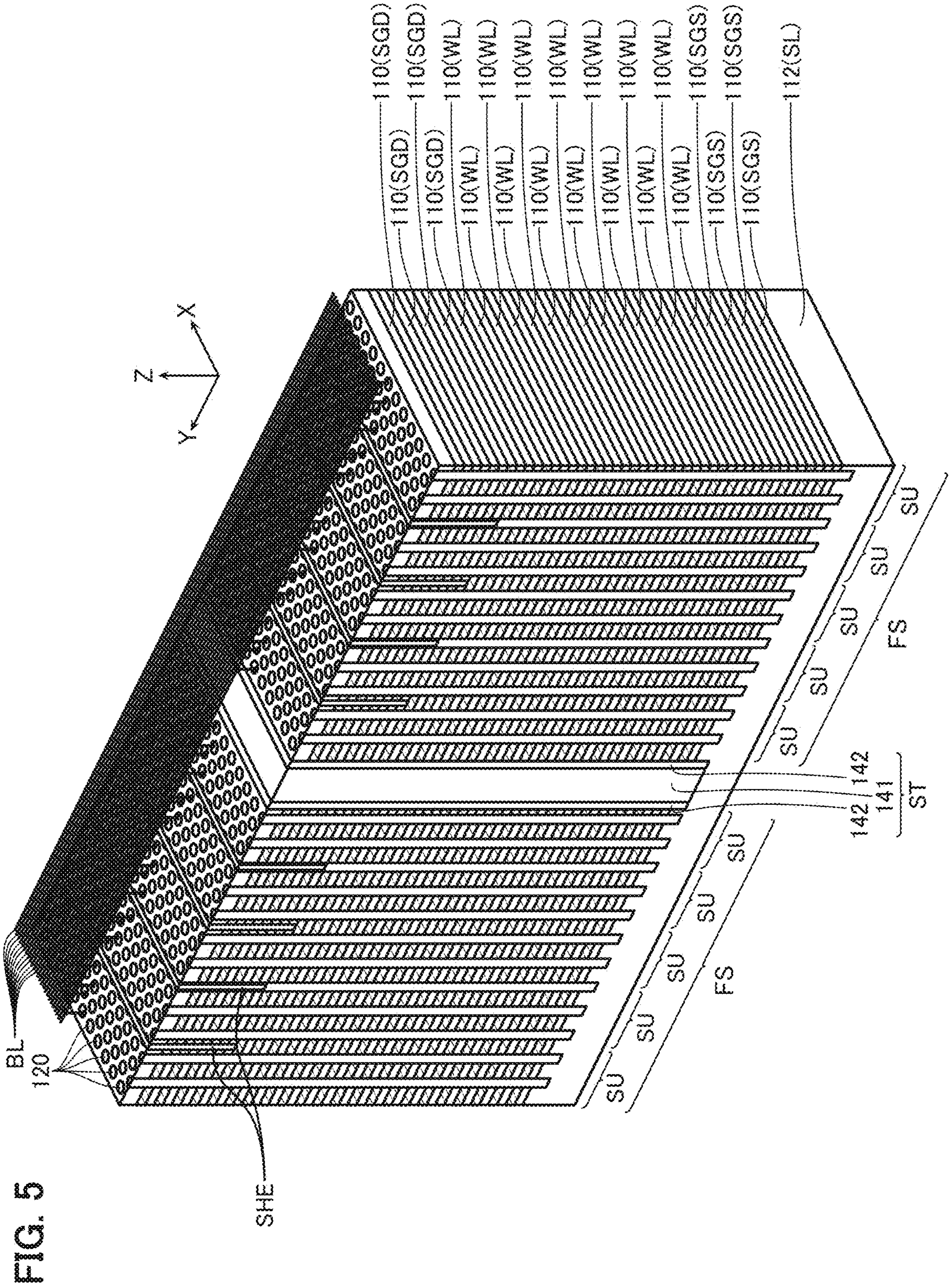
FIG. 5 is a schematic perspective view showing a part of the configurations of the memory die MD.
Figure 6:
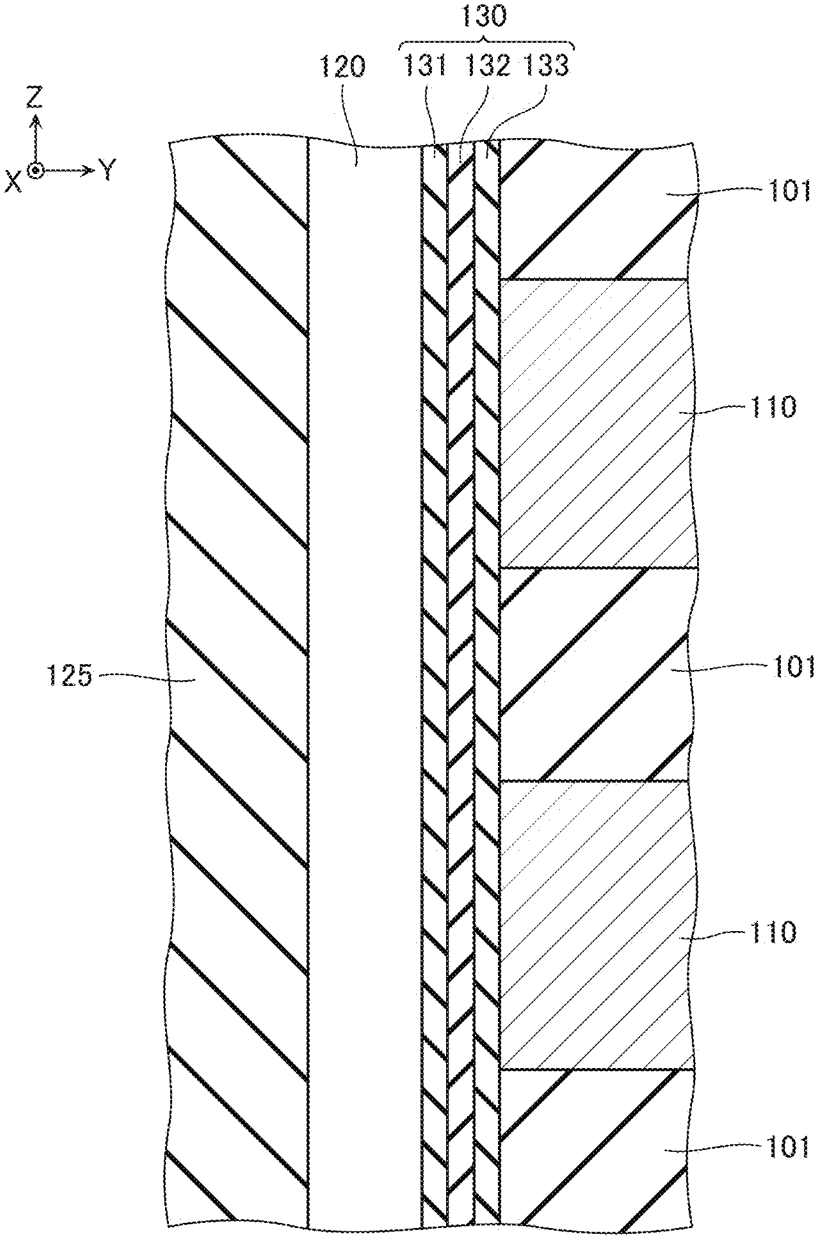
FIG. 6 is a schematic enlarged view showing a part of the configurations of FIG. 5.

FIG. 5 is a schematic perspective view showing a part of the configurations of the memory die MD. FIG. 6 is a schematic enlarged view showing a part of the configurations of FIG. 5. Note that FIGS. 5 and 6 show schematic configurations, and specific configurations may be appropriately changed. Moreover, in FIGS. 5 and 6, some configurations are omitted.

The memory cell array MCA comprises a plurality of finger structures FS (the memory blocks BLK) arranged in the Y-direction. As shown in FIG. 5, for example, the finger structure FS comprises five string units SU arranged in the Y-direction. An inter-finger structure ST is provided between two finger structures FS adjacent in the Y-direction. Moreover, an inter-string unit insulating member SHE of the likes of silicon oxide ($SiO_2$) is provided between two string units SU adjacent in the Y-direction.

In the present embodiment, one finger structure FS functions as one memory block BLK. However, it is possible for a plurality of the finger structures FS to function as one memory block BLK. Moreover, the finger structure FS may comprise one to four of the string units SU, or may comprise six or more of the string units SU. The finger structure FS comprises: a plurality of conductive layers 110 arranged in the Z-direction; a wiring layer 112 provided below the plurality of conductive layers 110; and a plurality of semiconductor columns 120 extending in the Z-direction. Moreover, as shown in FIG. 6, a gate insulating film 130 is provided between each of the plurality of conductive layers 110 and the plurality of semiconductor columns 120.

The conductive layer 110 comprises a substantially plate-like shape extending in the X-direction. The conductive layer 110 may include a stacked film having stacked therein a barrier conductive film of the likes of titanium nitride (TiN) and a metal film of the likes of tungsten (W), and so on. Moreover, the conductive layer 110 may include the likes of polycrystalline silicon including an impurity such as phosphorus (P) or boron (B), for example. An insulating layer 101 (FIG. 6) of the likes of silicon oxide ($SiO_2$) is provided between the plurality of conductive layers 110 arranged in the Z-direction.

A plurality of the conductive layers 110 function as the word lines WL (FIG. 3) and as the gate electrodes of the pluralities of memory cells MC connected to these word lines WL. In the description below, such conductive layers 110 will sometimes be referred to as conductive layers 110(WL). These plurality of conductive layers 110(WL) are each electrically independent every finger structure FS. Focusing on two finger structures FS adjacent in the Y-direction, the plurality of conductive layers 110(WL) arranged in the Z-direction and the plurality of insulating layers 101 provided on upper and lower surfaces of these plurality of conductive layers 110(WL) arranged in the Z-direction in these two finger structures FS, are separated in the Y-direction via the inter-finger structure ST.

One or a plurality of conductive layers 110 (FIG. 5) located below the plurality of conductive layers 110(WL) function as the source side select gate line SGS (FIG. 3) and as the gate electrodes of the plurality of source side select transistors STS connected to this source side select gate line SGS. In the description below, such conductive layers 110 will sometimes be referred to as conductive layers 110 (SGS). Focusing on two finger structures FS adjacent in the Y-direction, one or a plurality of conductive layers 110 (SGS) and a plurality of insulating layers 101 provided on upper and lower surfaces of these one or plurality of conductive layers 110(SGS) in these two finger structures FS, are separated in the Y-direction via the inter-finger structure ST.

One or a plurality of conductive layers 110 located above the plurality of conductive layers 110(WL) respectively function as the drain side select gate line SGD (FIG. 3) and as the gate electrodes of the plurality of drain side select transistors STD connected to this drain side select gate line SGD. In the description below, such conductive layers 110 will sometimes be referred to as conductive layers 110 (SGD).

The plurality of conductive layers 110(SGD) are each electrically independent every string unit SU. Focusing on two string units SU adjacent in the Y-direction in each finger structure FS, one or a plurality of conductive layers 110 (SGD) in these two string units SU are separated in the Y-direction via the inter-string unit insulating member SHE. Focusing on that one of the plurality of string units SU included in one of two finger structures FS adjacent in the Y-direction, that is closest to the other of the two finger structures FS adjacent in the Y-direction, and that one of the plurality of string units SU included in the other of the two finger structures FS adjacent in the Y-direction, that is closest to the one of the two finger structures FS adjacent in the Y-direction, one or a plurality of conductive layers 110(SGD) in these two string units SU are separated in the Y-direction via the inter-finger structure ST.

The wiring layer 112 (FIG. 5) may include the likes of polycrystalline silicon including an N-type impurity such as phosphorus (P), for example. Moreover, a lower surface of the wiring layer 112 may be provided with a metal such as tungsten (W), a conductive member of the likes of tungsten silicide, or another conductive member. The wiring layer 112 functions as a part of the source line SL (FIG. 3).

A plurality of the semiconductor columns 120 are arranged in the X-direction and the Y-direction, as shown in FIG. 5. The semiconductor column 120 is a semiconductor film of the likes of non-doped polycrystalline silicon (Si), for example. The semiconductor column 120, which has a substantially cylindrical shape, has its central portion provided with an insulating film 125 (FIG. 6) of the likes of silicon oxide. Moreover, an outer peripheral surface of the semiconductor column 120 is surrounded by respective ones of the conductive layers 110. A lower end portion of the semiconductor column 120 is connected to a semiconductor layer in the above-described wiring layer 112. An upper end portion of the semiconductor column 120 is electrically connected to the bit line BL via an unillustrated contact. The semiconductor column 120 functions as each of the channel regions of the plurality of memory cells MC and the select transistors STD, STS included in one memory string MS (FIG. 3).

The gate insulating film 130 has a substantially cylindrical shape covering the outer peripheral surface of the semiconductor column 120. The gate insulating film 130 comprises a tunnel insulating film 131, an electric charge accumulating film 132, and a block insulating film 133 that are stacked between the semiconductor column 120 and the conductive layer 110, as shown in FIG. 6, for example. The tunnel insulating film 131 and the block insulating film 133 include the likes of silicon oxide ($SiO_2$), for example. The electric charge accumulating film 132 includes a film capable of accumulating a charge, of the likes of silicon nitride (SiN), for example. The tunnel insulating film 131, the electric charge accumulating film 132, and the block insulating film 133 have substantially cylindrical shapes, and extend in the Z-direction along the outer peripheral surface of the semiconductor column 120 excluding a portion of contact between the semiconductor column 120 and the wiring layer 112 (FIG. 5).

Note that FIG. 6 shows an example where the gate insulating film 130 comprises the electric charge accumulating film 132 of the likes of silicon nitride. However, an electric charge accumulating film included in the gate insulating film 130 may be a floating gate of the likes of polycrystalline silicon including an N-type or P-type impurity, for example.

As shown in FIG. 5, for example, the inter-string unit insulating member SHE extends in the X-direction and the Z-direction, and divides the plurality of conductive layers 110(SGD) in the Y-direction. The inter-string unit insulating member SHE includes the likes of silicon oxide ($SiO_2$), for example. As shown in FIG. 5, a lower end of the inter-string unit insulating member SHE is located above a lower surface of the most upwardly located conductive layer 110(WL). Moreover, the lower end of the inter-string unit insulating member SHE is located below a lower surface of the most downwardly located conductive layer 110(SGD).

As shown in FIG. 5, for example, the inter-finger structure ST comprises: an inter-finger electrode 141 extending in the X-direction and the Z-direction; and an inter-finger insulating member 142 of the likes of silicon oxide ($SiO_2$) provided on both side surfaces in the Y-direction of the inter-finger electrode 141. As shown in FIG. 5, lower ends of the inter-finger electrode 141 and inter-finger insulating member 142 are connected to the wiring layer 112. The inter-finger electrode 141 may be a conductive member including the likes of a stacked film having stacked therein a barrier conductive film of the likes of titanium nitride (TiN) and a metal film of the likes of tungsten (W), for example. Moreover, the inter-finger electrode 141 may be a semiconductor member of the likes of polycrystalline silicon including an impurity such as phosphorus (P) or boron (B), for example. The inter-finger electrode 141 may include both a conductive member and a semiconductor member. The inter-finger electrode 141 functions as a part of the source line SL (FIG. 3).

The bit lines BL extend in the Y-direction, and are arranged in the X-direction. The bit line BL may include the likes of a stacked film having stacked therein a barrier conductive film of the likes of titanium nitride (TiN) and a metal film of the likes of copper (Cu), for example.

Threshold Voltage of Memory Cell MC

As described with reference to FIG. 3, the memory cell MC stores data as magnitude of the threshold voltage. This point will be described below.

Figure 7:
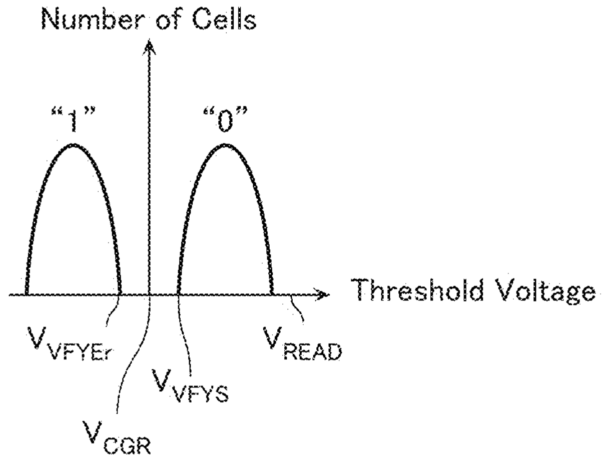
FIG. 7 is a schematic histogram for explaining a threshold voltage of a memory cell MC stored with 1-bit data.

FIG. 7 is a schematic histogram for explaining a threshold voltage of a memory cell MC stored with 1-bit data. The horizontal axis indicates voltage of the word line WL, and the vertical axis indicates the number of memory cells MC.

In the example of FIG. 7, the threshold voltage of the memory cell MC is controlled to two types of states. For example, a threshold voltage of a memory cell MC controlled to a lower state is smaller than an erase verify voltage $V_{VFYEr}$. Moreover, a threshold voltage of a memory cell MC controlled to a higher state is larger than a voltage $V_{VFYS}$, but smaller than a read pass voltage $V_{READ}$.

Moreover, in the example of FIG. 7, a read voltage $V_{CGR}$ is set between a threshold distribution corresponding to the lower state and a threshold distribution corresponding to the higher state. For example, the lower state corresponds to a low threshold voltage. A memory cell MC in the lower state is a memory cell MC in an erased state, for example. The memory cell MC in the lower state is assigned with data “1”, for example.

Moreover, the higher state corresponds to a high threshold voltage. A memory cell MC in the higher state is a memory cell MC in a written state, for example. The memory cell MC in the higher state is assigned with data “0”, for example.

Write Operation

Next, a write operation will be described.

Figure 8:
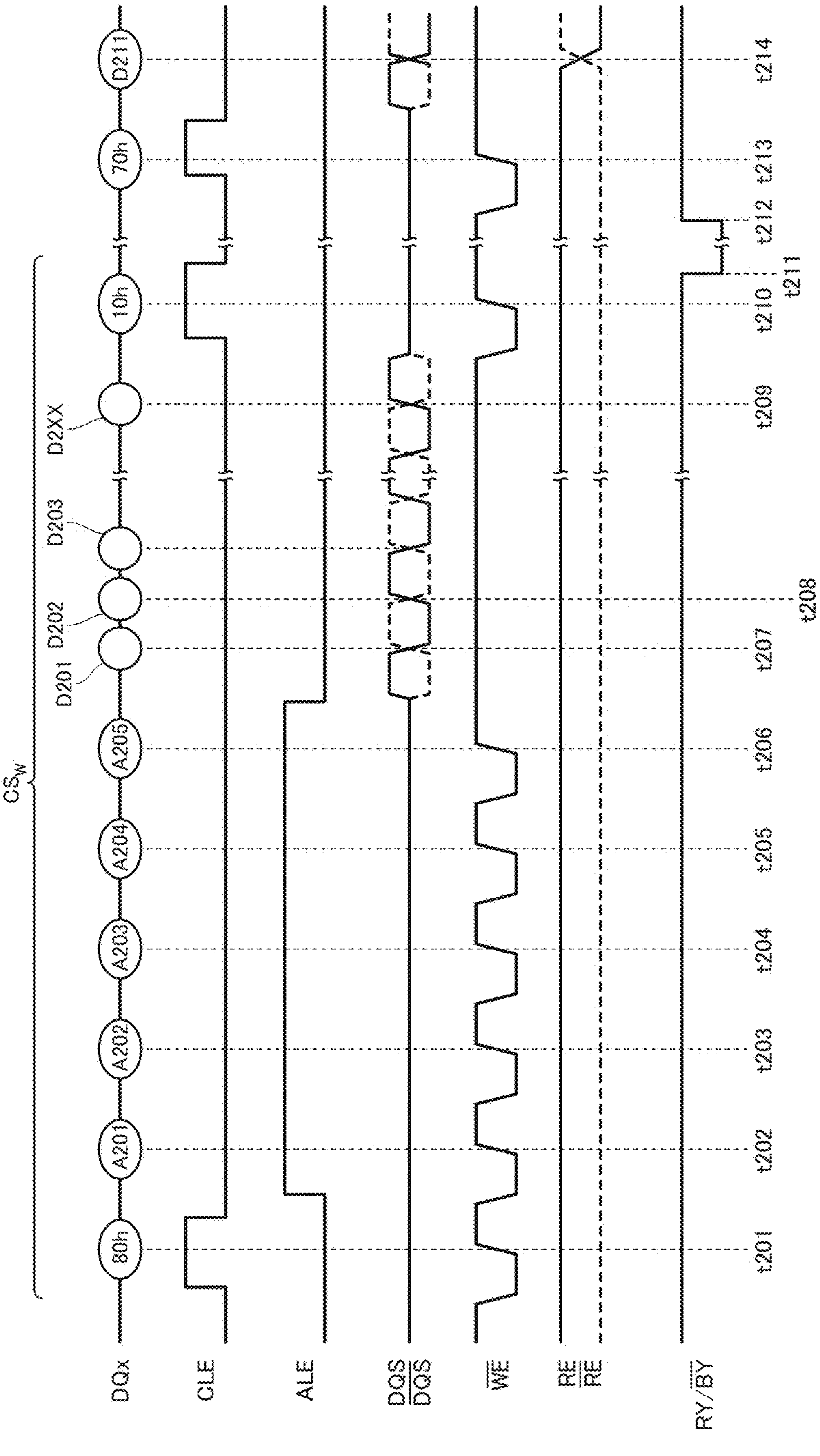
FIG. 8 is a timing chart for explaining a write operation.

FIG. 8 is a timing chart for explaining the write operation.

As described with reference to FIG. 2, the memory die MD comprises eight data signal input/output terminals DQ0 to DQ7. In the description below, 8-bit data inputted to these eight data signal input/output terminals DQ0 to DQ7 will sometimes be expressed using two-digit hexadecimal numbers. For example, when the eight data signal input/output terminals DQ0 to DQ7 are inputted with “0, 0, 0, 0, 0, 0, 0, 0”, this data will sometimes be expressed as data 00h, or the like. Moreover, when the eight data signal input/output terminals DQ0-DQ7 are inputted with “1, 1, 1, 1, 1, 1, 1, 1”, this data will sometimes be expressed as data FFh, or the like.

FIG. 8 exemplifies a command set $CS_W$ inputted to the memory die MD during the write operation. This command set $CS_W$ includes data 80h, A201, A202, A203, A204, A205, D201, D202 to D2XX, and data 10h.

At timing t201, the controller CD inputs the memory die MD with data 80h as command data $D_{CMD}$. That is, in a state of having set voltages of the data signal input/output terminals DQ0 to DQ7 to “H” or “L” depending on each bit of data 80h, having inputted the external control terminal CLE with “H”, and having inputted the external control terminal ALE with “L”, the controller CD raises the external control terminal /WE from “L” to “H”. Data 80h is a command inputted when starting the write operation.

At timing t202, the controller CD inputs the memory die MD with data A201 as address data $D_{ADD}$. That is, in a state of having set voltages of the data signal input/output terminals DQ0 to DQ7 to “H” or “L” depending on each bit of data A201, having inputted the external control terminal CLE with “L”, and having inputted the external control terminal ALE with “H”, the controller CD raises the external control terminal /WE from “L” to “H”. Data A201 is 8-bit data configuring a part of the column address CA (FIG. 2).

At timing t203, the controller CD inputs the memory die MD with data A202 as address data $D_{ADD}$. Data A202 is 8-bit data configuring a part of the column address CA (FIG. 2).

At timing t204, the controller CD inputs the memory die MD with data A203 as address data $D_{ADD}$. Data A203 is 8-bit data configuring a part of the row address RA (FIG. 2).

At timing t205, the controller CD inputs the memory die MD with data A204 as address data $D_{ADD}$. Data A204 is 8-bit data configuring a part of the row address RA (FIG. 2).

At timing t206, the controller CD inputs the memory die MD with data A205 as address data $D_{ADD}$. Data A205 is 8-bit data configuring a part of the row address RA (FIG. 2).

At timing t207, the controller CD inputs the memory die MD with data D201 as data DAT. That is, in a state of having set voltages of the data signal input/output terminals DQ0 to DQ7 to "H" or "L" depending on each bit of data D201, having inputted the external control terminal CLE with "L", and having inputted the external control terminal ALE with "L", the controller CD switches (toggles) input signals of the data strobe signal input/output terminals DQS, /DQS. Data D201 is an 8-bit portion of data of the data DAT to be written to the memory cell MC by the write operation.

At timing t208, the controller CD inputs the memory die MD with data D202 as data DAT. Data D202 is an 8-bit portion of data of the data DAT to be written to the memory cell MC by the write operation. Thereafter, the controller CD similarly inputs the memory die MD with eight bits at a time of data as data DAT.

At timing t209, the controller CD inputs the memory die MD with data D2XX as data DAT. Data D2XX is an 8-bit portion of data of the data DAT to be written to the memory cell MC by the write operation.

At timing t210, the controller CD inputs the memory die MD with data 10h as command data $D_{CMD}$. Data 10h is a command indicating that input of the command set relating to the write operation has finished.

At timing t211, the terminal RY//BY changes from "H" state to "L" state, and access to the memory die MD is prohibited. Moreover, the write operation is executed in the memory die MD.

At timing t212, the write operation in the memory die MD finishes. Moreover, the terminal RY//BY changes from "L" state to "H" state, and access to the memory die MD is allowed.

At timing t213, the controller CD inputs the memory die MD with data 70h as command data $D_{CMD}$, for example. Data 70h is a command requesting output of status data $D_{ST}$ held in the status register STR (FIG. 2).

At timing t214, the controller CD causes data D211, for example, to be outputted from the memory die MD. Data D211 is status data $D_{ST}$ (FIG. 2).

Program Operation

The write operation includes a plurality of operations. In the description below, a program operation being one of those plurality of operations will be described. The program operation is an operation in which a program voltage is applied to a selected word line $WL_S$ to increase a threshold voltage of a memory cell MC.

Note that in the description below, sometimes, the word line WL representing a target of operation of the write operation, and so on, will be referred to as a selected word line $WL_S$, and the other word lines WL will be referred to as unselected word lines $WL_U$. Moreover, in the description below, those memory cells MC connected to the selected word line $WL_S$, of the plurality of memory cells MC included in the string unit SU representing a target of operation of the write operation, and so on, will sometimes be referred to as "selected memory cells MC". Moreover, in the description below, a configuration including such a plurality of selected memory cells MC will sometimes be referred to as a selected page PG.

Figure 9:
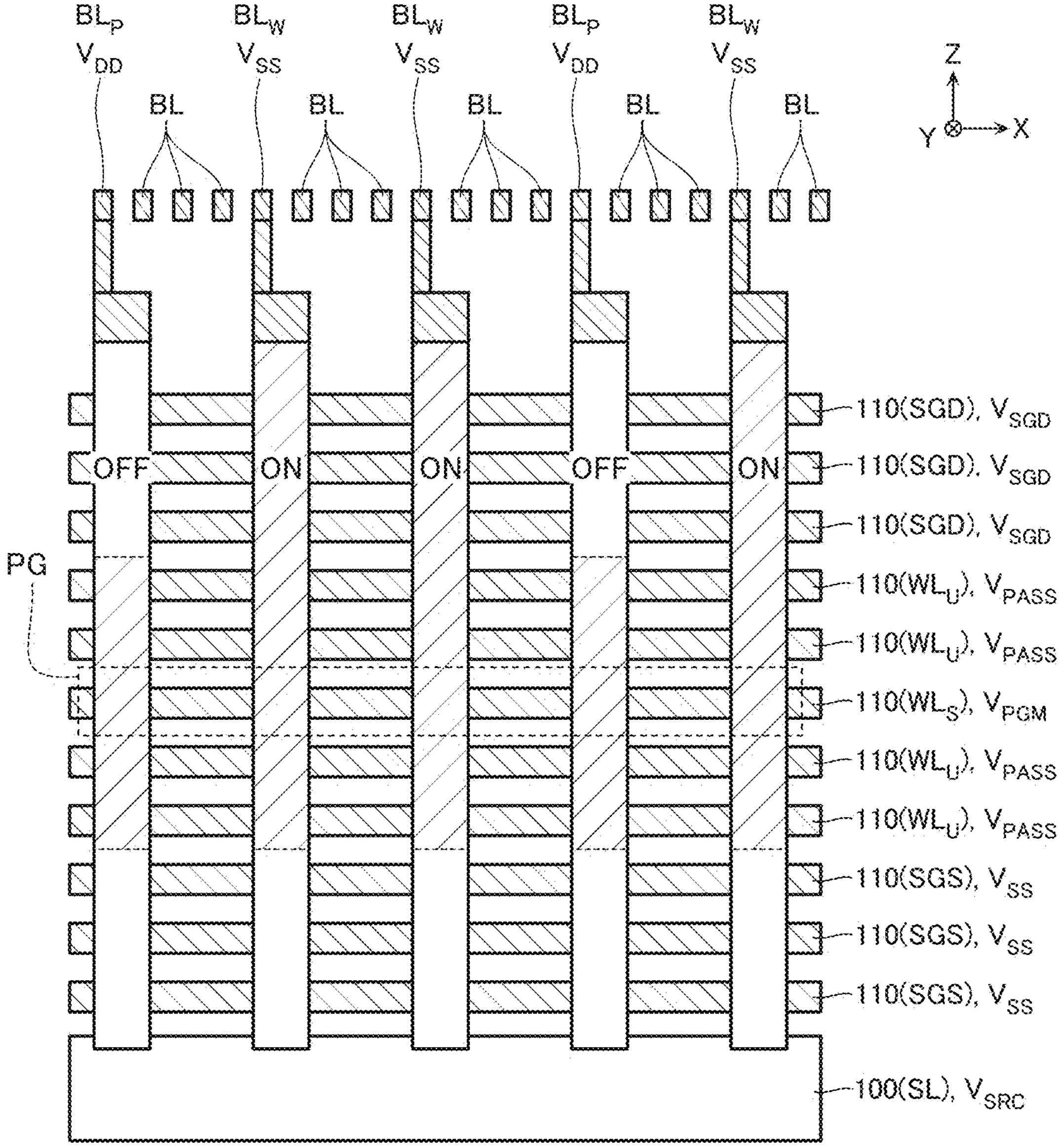
FIG. 9 is a schematic cross-sectional view for explaining a program operation.

FIG. 9 is a schematic cross-sectional view for explaining the program operation.

In the program operation, for example, bit lines $BL_W$ connected to those of the plurality of selected memory cells MC that are to undergo adjustment of their threshold voltage, are applied with the voltage $V_{SS}$. Moreover, bit lines $BL_P$ connected to those of the plurality of selected memory cells MC that are not to undergo adjustment of their threshold voltage, are applied with the voltage $V_{DD}$. The voltage $V_{DD}$ is larger than the voltage $V_{SS}$. For example, the plurality of latch circuits DL0 to DLn within the sense amplifier module SAM respectively hold data to be written by the write operation. If, in this state, states of the signal lines STB, XXL, BLC, BLS, HLL, BLX described with reference to FIG. 4 are set to "L, L, H, H, L, H", then the bit lines $BL_W$ will be applied with the voltage $V_{SS}$, and the bit lines $BL_P$ will be applied with the voltage $V_{DD}$.

Moreover, in the program operation, the drain side select gate lines SGD are applied with a voltage $V_{SGD}$.

The voltage $V_{SGD}$ is larger than the voltage $V_{SS}$. Moreover, a voltage difference between the voltage $V_{SGD}$ and the voltage $V_{SS}$ is larger than a threshold voltage when the drain side select transistor STD is operated as an NMOS transistor. Hence, the channel region of the drain side select transistor STD connected to the bit line $BL_W$ has a channel of electrons formed therein, and has the voltage $V_{SS}$ transferred thereto.

On the other hand, a voltage difference between the voltage $V_{SGD}$ and the voltage $V_{DD}$ is smaller than the threshold voltage when the drain side select transistor STD is operated as an NMOS transistor. Hence, the drain side select transistor STD connected to the bit line $BL_P$ attains an OFF state.

Moreover, in the program operation, the source line SL is applied with a voltage $V_{SRC}$, and the source side select gate lines SGS are applied with the voltage $V_{SS}$. The voltage $V_{SRC}$ is slightly larger than the voltage $V_{SS}$. As a result, the source side select transistor STS attains an OFF state. Moreover, in the program operation, the unselected word lines $WL_U$ are applied with a write pass voltage $V_{PASS}$. The write pass voltage $V_{PASS}$ is larger than the read pass voltage $V_{READ}$ described with reference to FIG. 7. Moreover, a voltage difference between the write pass voltage $V_{PASS}$ and the voltage $V_{SS}$ is larger than a threshold voltage when the memory cell MC is operated as an NMOS transistor, regardless of data stored in the memory cell MC. Hence, the channel region of an unselected memory cell MC has a channel of electrons formed therein, and a write memory cell MC has the voltage $V_{SS}$ transferred thereto.

Moreover, in the program operation, the selected word line $WL_S$ is applied with a program voltage $V_{PGM}$. The program voltage $V_{PGM}$ is larger than the write pass voltage $V_{PASS}$.

Now, the channel of the semiconductor column 120 connected to the bit line $BL_W$ is applied with the voltage $V_{SS}$. A comparatively large electric field is generated between such a semiconductor column 120 and the selected word line $WL_S$. As a result, electrons in the channel of the semiconductor column 120 tunnel into the electric charge accumulating film 132 (FIG. 6) via the tunnel insulating film 131 (FIG. 6). Hence, a threshold voltage of the write memory cell MC increases.

On the other hand, the channel of the semiconductor column 120 connected to the bit line $BL_P$ is in an electrically floating state, and a potential of this channel rises to about the write pass voltage $V_{PASS}$ due to capacitive coupling with the unselected word lines $WL_U$. Between such a semiconductor column 120 and the selected word line $WL_S$, there is only generated an electric field which is smaller than the above-described electric field. Hence, electrons in the channel of the semiconductor column 120 do not tunnel into the electric charge accumulating film 132 (FIG. 6). Consequently, there is no increase in a threshold voltage of a prohibit memory cell MC.

Note that in the program operation, the bit lines $BL_W$ connected to a part of those of the plurality of selected memory cells MC that are to undergo adjustment of their threshold voltage, may be applied with a voltage which is larger than the voltage $V_{SS}$ but smaller than the voltage $V_{DD}$, for example.

Order of Execution of Write Operation

Figure 10:
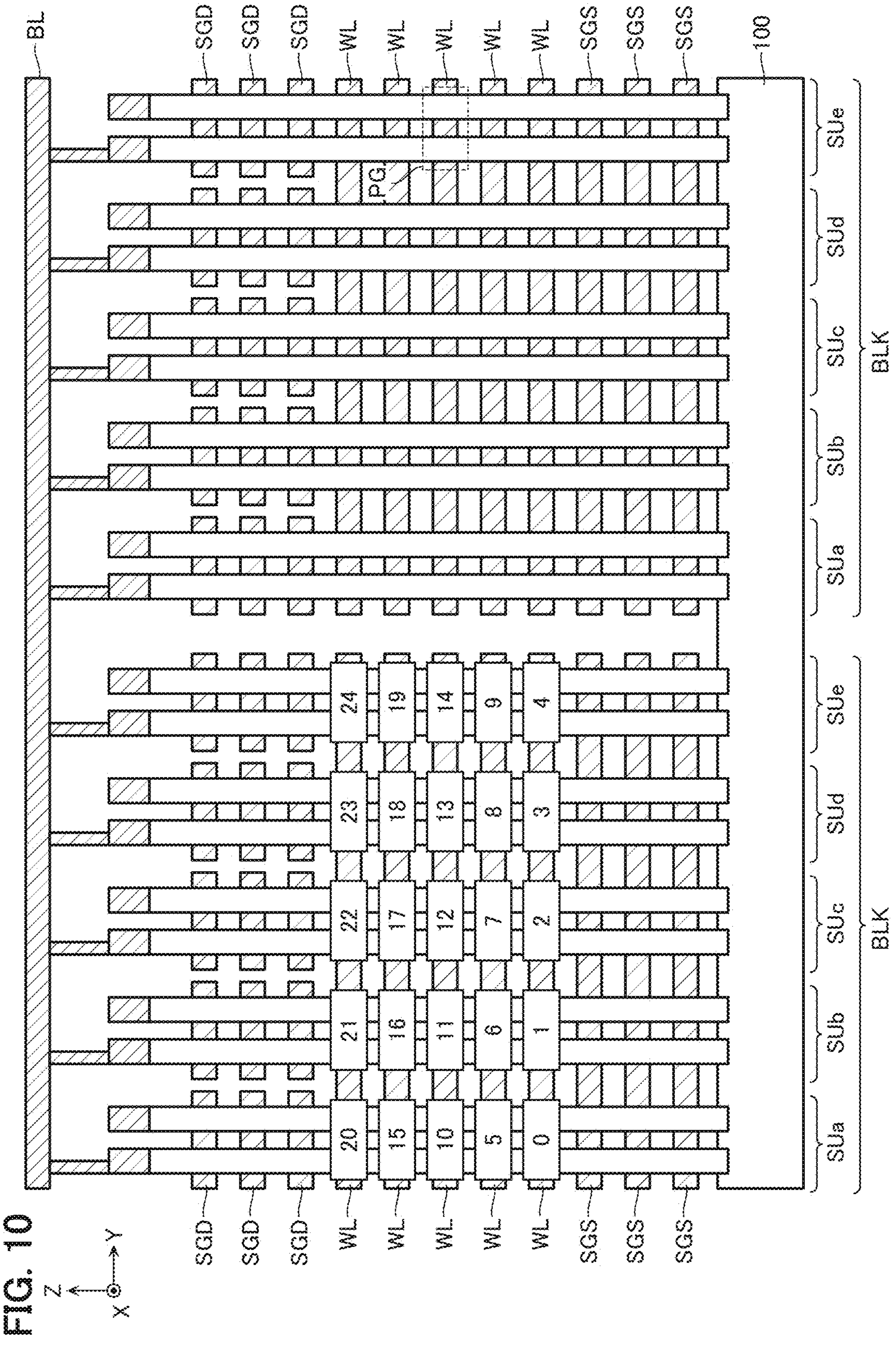
FIG. 10 is a schematic cross-sectional view for explaining order of execution of the write operation.

Next, order of execution of the write operation will be described. FIG. 10 is a schematic cross-sectional view for explaining order of execution of the write operation.

In FIG. 10, two memory blocks BLK are exemplified. Moreover, in the example of FIG. 10, the memory block BLK comprises five word lines WL and five string units SUa to SUe. Hence, in the example of FIG. 10, the memory block BLK comprises 25 pages PG. For example, if the memory cell MC stores 1-bit data, then data corresponding to 25 pages PG will be stored in the memory block BLK.

Moreover, in FIG. 10, order of execution of the write operation is exemplified. In the example of FIG. 10, first, the write operation is sequentially executed on the five pages PG corresponding to the first word line WL counting from below. In each write operation, data corresponding to one page PG is stored in a page PG in an erased state. That is, a memory cell MC corresponding to the lower state is controlled to two types of states, by one time of the write operation. Next, the write operation is sequentially executed on the five pages PG corresponding to the second word line WL counting from below. Thereafter, the write operation is similarly sequentially executed on the 15 pages PG corresponding to the third through fifth word lines WL counting from below.

First-Mode Write Operation

As mentioned above, the write operation includes a plurality of operations including the program operation. For example, sometimes, before execution of the program operation, there is executed a pre-charge operation where charging of the bit lines BL, and so on, is performed. Moreover, sometimes, after execution of the program operation, there is executed an equalize operation where discharging of the word lines WL, and so on, is performed.

Now, for example, when the program operation is executed on a plurality of the pages PG one after another, it is conceivable for the first page PG to be handled by executing it with the pre-charge operation, program operation, and equalize operation, and then for the second page PG to be handled by executing it with the pre-charge operation, program operation, and equalize operation.

On the other hand, it is also conceivable for the first page PG to be handled by executing it with the pre-charge operation and program operation, and then for a single time portion each of the discharge operation and pre-charge operation to be omitted, and the second page PG be executed with the program operation and equalize operation. Such a method will make it possible to provide a semiconductor memory device in which time required for the write operation is shortened to enable high speed operation.

Such a method will be described below as a first-mode write operation. In the first-mode write operation, a first pre-charge operation and a first program operation are sequentially executed, and uninterruptedly thereafter, a second program operation is executed. Note that in the first-mode write operation, a binary value (1 bit) is held in the plurality of memory cells MC.

Figure 11:
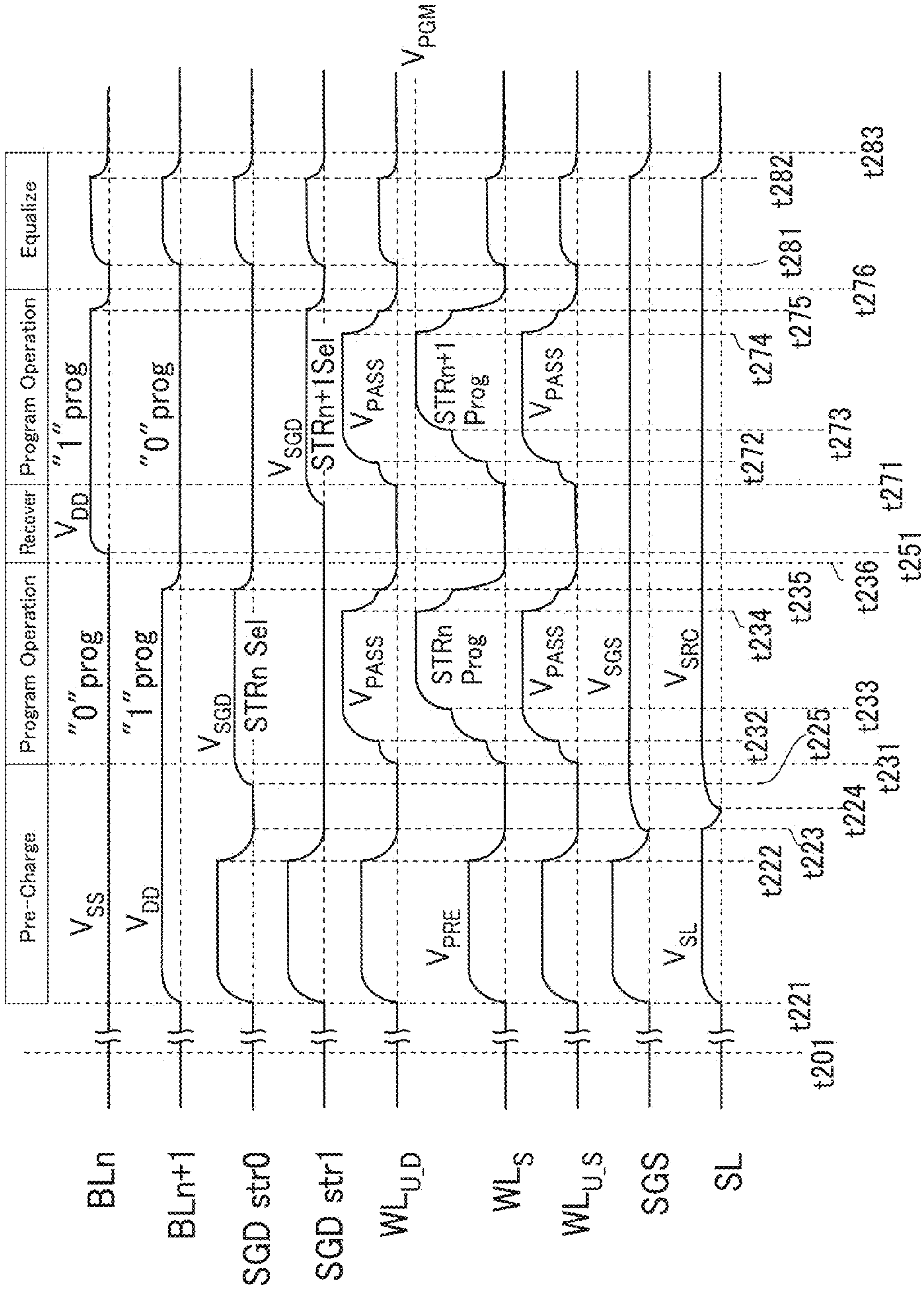
FIG. 11 is a timing chart for explaining a first-mode write operation.

FIG. 11 is a timing chart for explaining the first-mode write operation. In FIG. 11, the drain side select gate lines SGD of differing two string units SU within one memory block BLK will be referred to as select gate lines SGDstr0, SGDstr1. The select gate line SGDstr0 is the drain side select gate line SGD corresponding to the page PG representing a target of write by the first program operation. The select gate line SGDstr1 is the drain side select gate line SGD corresponding to the page PG representing a target of write by the second program operation. Moreover, those of the plurality of unselected word lines $WL_U$ located on a drain side select gate line SGD side of the selected word line $WL_S$ will sometimes be referred to as drain side unselected word lines $WL_{U\_D}$, and those of the plurality of unselected word lines $WL_U$ located on a source side select gate line SGS side of the selected word line $WL_S$ will sometimes be referred to as source side unselected word lines $WL_{U\_S}$.

From timing t221 to timing t231, the first pre-charge operation in which target wirings are pre-charged by being applied with certain voltages, is executed.

At timing t221 of the first pre-charge operation, for example, bit lines $BL_n$ that are to be the bit lines $BL_W$ in the first program operation are applied with the voltage $V_{SS}$ (a second voltage), bit lines $BL_{n+1}$ that are to be the bit lines $BL_P$ in the first program operation are applied with the voltage $V_{DD}$ (a fourth voltage), and the source line SL is applied with a voltage $V_{SL}$. Moreover, at timing t221 of the first pre-charge operation, the select gate lines SGDstr0, SGDstr1, the selected word line $WL_S$, the drain side unselected word lines $WL_{U\_D}$, the source side unselected word lines $WL_{U\_S}$, and the source side select gate line SGS are applied with a voltage $V_{PRE}$ (a third voltage), and the voltage $V_{SS}$ is raised to the voltage $V_{PRE}$. The voltage $V_{DD}$, voltage $V_{SL}$, and the voltage $V_{PRE}$ are larger voltages than the voltage $V_{SS}$. The voltage $V_{PRE}$ is a larger voltage than the voltage $V_{DD}$ and the voltage $V_{SL}$. The voltage $V_{DD}$ and the voltage $V_{SL}$ are voltages of different magnitudes, but may be voltages of the same magnitude.

At timing t222 of the first pre-charge operation, the select gate lines SGDstr0, SGDstr1, the selected word line $WL_S$, the drain side unselected word lines $WL_{U\_D}$, the source side unselected word lines $WL_{U\_S}$, and the source side select gate line SGS are applied with the voltage $V_{SS}$, and the voltage $V_{PRE}$ is lowered to the voltage $V_{SS}$.

At timing t223 of the first pre-charge operation, the source line SL is applied with the voltage $V_{SS}$, and the voltage $V_{SL}$ is lowered to the voltage $V_{SS}$. Moreover, the source side select gate line SGS is applied with a voltage $V_{SGS}$, and the voltage $V_{SS}$ is raised to the voltage $V_{SGS}$. The voltage $V_{SGS}$ has sufficient magnitude to prevent the source side select transistor STS from attaining an ON state. Note that at timing t223 of the first pre-charge operation, the source side select gate line SGS may continue to be applied with the voltage $V_{SS}$, unchanged.

At timing t224 of the first pre-charge operation, the source line SL is applied with the voltage $V_{SRC}$, and the voltage $V_{SS}$ is raised to the voltage $V_{SRC}$. Note that at timing t224 of the first pre-charge operation, the source line SL may continue to be applied with the voltage $V_{SS}$, unchanged.

At timing t225 of the first pre-charge operation, the select gate line SGDstr0 representing a target of write by the first program operation is applied with the voltage $V_{SGD}$.

From timing t231 to timing t236, the first program operation is executed.

At timing t231 of the first program operation, for example, the bit lines $BL_{n+1}$ that are to be the bit lines $BL_P$ in the first program operation are applied with the voltage $V_P$ (a first voltage), the bit lines $BL_n$ that are to be the bit lines $BL_W$ in the first program operation are applied with the voltage $V_{SS}$, the select gate line SGDstr0 is applied with the voltage $V_{SGD}$, and the select gate line SGDstr1 is applied with the voltage $V_{SS}$. Moreover, at timing t231 of the first program operation, the selected word line $WL_S$, the drain side unselected word lines $WL_{U\_D}$, and the source side unselected word lines $WL_{U\_S}$ are applied with a voltage $V_{DD}$-$V_{th}$, and the voltage $V_{SS}$ is raised to the voltage $V_{DD}$-$V_{th}$. Note that the voltage $V_{DD}$ is a voltage of about a voltage on a high voltage side of the power supply voltage, for example. The voltage $V_{th}$ is a voltage of magnitude of about a threshold voltage of the transistor having the largest threshold voltage among the plurality of transistors electrically connected between a pad electrode applied with a voltage on the high voltage side of the power supply voltage and the word line WL, for example.

At timing t232 of the first program operation, the selected word line $WL_S$, the drain side unselected word lines $WL_{U\_D}$, and the source side unselected word lines $WL_{U\_S}$ are applied with the write pass voltage $V_{PASS}$.

At timing t233 of the first program operation, the selected word line $WL_S$ is applied with a first program voltage $V_{PGM}$.

At timing t234 of the first program operation, the selected word line $WL_S$ is applied with the write pass voltage $V_{PASS}$ and the first program voltage $V_{PGM}$ is lowered to the write pass voltage $V_{PASS}$, and the drain side unselected word lines $WL_{U\_D}$ and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t235 of the first program operation, the bit lines $BL_{n+1}$, the select gate line SGDstr0, the selected word line $WL_S$, the drain side unselected word lines $WL_{U\_D}$, and the source side unselected word lines $WL_{U\_S}$ are applied with the voltage $V_{SS}$, and the voltage $V_{DD}$ of the bit lines $BL_{n+1}$, the voltage $V_{SGD}$ of the select gate line SGDstr0, the write pass voltage $V_{PASS}$ of the selected word line $WL_S$, and the voltage $V_{DD}$-$V_{th}$ of the drain side unselected word lines $WL_{U\_D}$ and the source side unselected word lines $WL_{U\_S}$ are lowered to the voltage $V_{SS}$.

From timing t251 to timing t271, a recovery operation is executed.

At timing t251 of the recovery operation, for example, the bit lines $BL_n$ that are to be the bit lines $BL_P$ in the second program operation are applied with the voltage $V_{DD}$, and the bit lines $BL_{n+1}$ that are to be the bit lines $BL_W$ in the second program operation are applied with the voltage $V_{SS}$.

From timing t271 to timing t276, the second program operation is executed.

At timing t271 of the second program operation, for example, the bit lines $BL_n$ that are to be the bit lines $BL_P$ in the second program operation are applied with the voltage $V_{DD}$, the bit lines $BL_{n+1}$ that are to be the bit lines $BL_W$ in the second program operation are applied with the voltage $V_{SS}$, the select gate line SGDstr1 is applied with the voltage $V_{SGD}$, and the select gate line SGDstr0 is applied with the voltage $V_{SS}$. Moreover, at timing t271 of the second program operation, the selected word line $WL_S$, the drain side unselected word lines $WL_{U\_D}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timings t272 to t276 of the second program operation, similar operations to at timings t231 to t236 of the first program operation are executed.

From timing t276 to timing t283 after the second program operation, the equalize operation (discharging) is executed.

At timing t281 of the equalize operation, the bit lines $BL_n$, the bit lines $BL_{n+1}$, the select gate line SGDstr0, the select gate line SGDstr1, the selected word line $WL_S$, the drain side unselected word lines $WL_{U\_D}$, and the source side unselected word lines $WL_{U\_S}$ are applied with an open circuit voltage, and the select transistors (STD, STS) and the plurality of memory cells MC in the string unit SU are set to an ON state.

At timing t282 of the equalize operation, the bit lines $BL_n$, the bit lines $BL_{n+1}$, the select gate line SGDstr0, the select gate line SGDstr1, the selected word line $WL_S$, the drain side unselected word lines $WL_{U\_D}$, the source side unselected word lines $WL_{U\_S}$, the source side select gate line SGS, and the source line SL are applied with the voltage $V_{SS}$, and the select transistors (STD, STS) and the plurality of memory cells MC of string units $SU_0$, $SU_1$ are set to an OFF state.

Second-Mode Write Operation

Next, a second-mode write operation in which the first pre-charge operation and the first program operation are sequentially executed, and thereafter, a second pre-charge operation and the second program operation are sequentially executed, will be described with reference to FIG. 12. Note that in the second-mode write operation too, a binary value (1 bit) is held in the plurality of memory cells MC.

Figure 12:
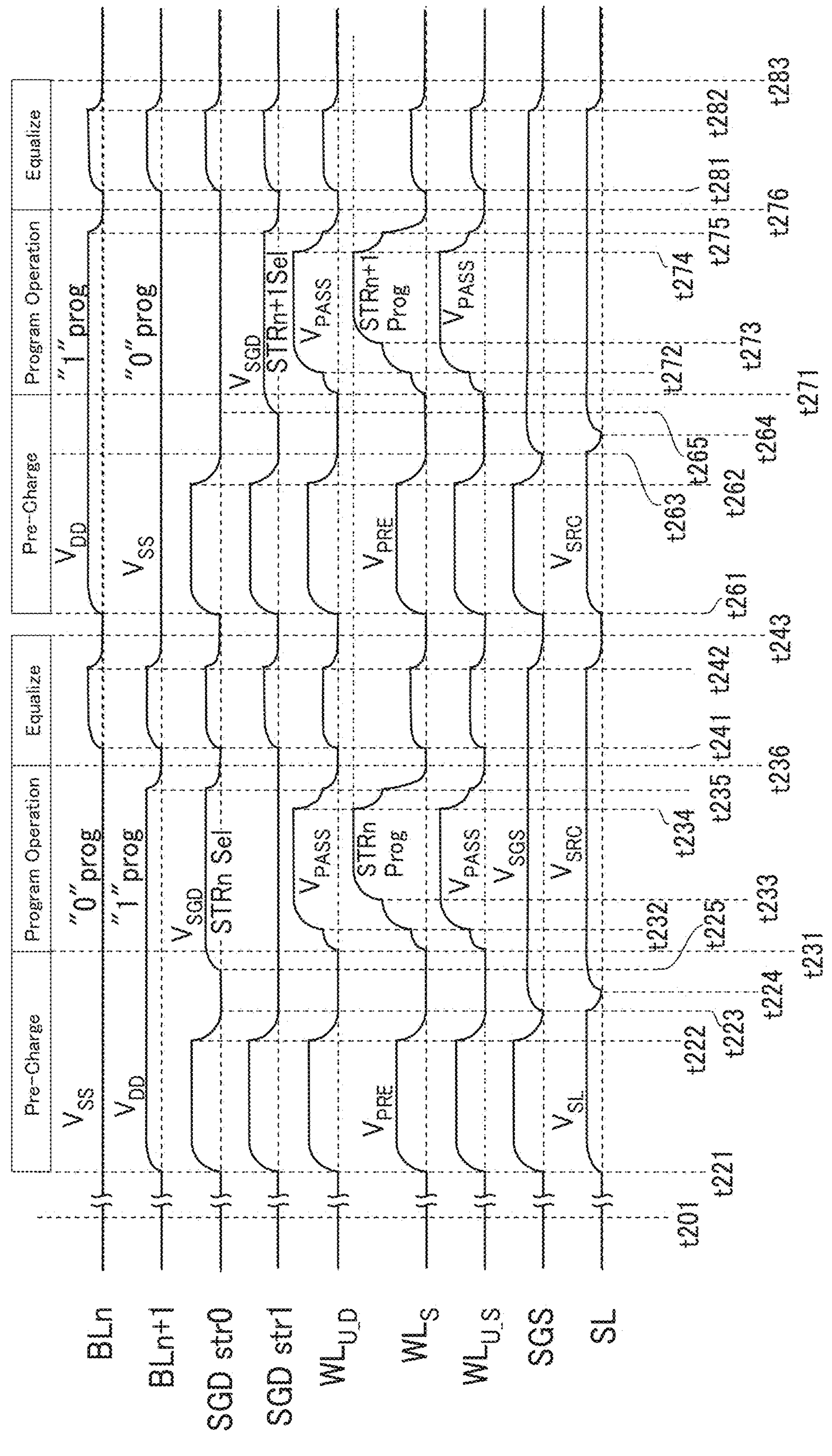
FIG. 12 is a timing chart for explaining a second-mode write operation.

FIG. 12 is a timing chart for explaining the second-mode write operation. The select gate line SGDstr0, the select gate line SGDstr1, the drain side unselected word lines $WL_{U\_D}$, and the source side unselected word lines $WL_{U\_S}$ of FIG. 12 are as described by FIG. 11.

From timing t221 to timing t231, the first pre-charge operation in which target wirings are pre-charged by being applied with certain voltages, is executed. Specific operation is as in the first pre-charge operation described in the first-mode write operation with reference to FIG. 11.

From timing t231 to timing t236, the first program operation is executed. Specific operation is as in the first program operation described in the first-mode write operation with reference to FIG. 11.

From timing t236 to timing t243 after the first program operation, the equalize operation (discharging) is executed.

At timing t241 of the equalize operation, the bit lines $BL_n$, the bit lines $BL_{n+1}$, the select gate line SGDstr0, the select gate line SGDstr1, the selected word line $WL_S$, the drain side unselected word lines $WL_{U\_D}$, and the source side unselected word lines $WL_{U\_S}$ are applied with an open circuit voltage, and the select transistors (STD, STS) and the plurality of memory cells MC of the string units $SU_0$, $SU_1$ are set to an ON state.

At timing t242 of the equalize operation, the bit lines $BL_n$, the bit lines $BL_{n+1}$, the select gate line SGDstr0, the select gate line SGDstr1, the selected word line $WL_S$, the drain side unselected word lines $WL_{U\_D}$, the source side unselected word lines $WL_{U\_S}$, the source side select gate line SGS, and the source line SL are applied with the voltage $V_{SS}$, and the select transistors (STD, STS) and the plurality of memory cells MC of the string units $SU_0$, $SU_1$ are set to an OFF state.

From timing t261 to timing t271, the second pre-charge operation in which target wirings are pre-charged by being applied with certain voltages, is executed. At timing t261 of the second pre-charge operation, for example, the bit lines $BL_{n+1}$ that are to be the bit lines $BL_W$ in the second program operation are applied with the voltage $V_{SS}$, the bit lines $BL_n$ that are to be the bit lines $BL_P$ in the second program operation are applied with the voltage $V_{DD}$, and the source line SL is applied with the voltage $V_{SL}$. Moreover, the select gate lines SGDstr0, SGDstr1, the selected word line $WL_S$, the drain side unselected word lines $WL_{U\_D}$, the source side unselected word lines $WL_{U\_S}$, and the source side select gate line SGS are applied with the voltage $V_{PRE}$, and the voltage $V_{SS}$ is raised to the voltage $V_{PRE}$.

At timing t262 of the second pre-charge operation, the select gate lines SGDstr0, SGDstr1, the selected word line $WL_S$, the drain side unselected word lines $WL_{U\_D}$, the source side unselected word lines $WL_{U\_S}$, and the source side select gate line SGS are applied with the voltage $V_{SS}$, and the voltage $V_{PRE}$ is lowered to the voltage $V_{SS}$.

At timing t263 of the second pre-charge operation, the source line SL is applied with the voltage $V_{SS}$, and the voltage $V_{SL}$ is lowered to the voltage $V_{SS}$. Moreover, the source side select gate line SGS is applied with the voltage $V_{SGS}$, and the voltage $V_{SS}$ is raised to the voltage $V_{SGS}$. Note that at timing t263 of the second pre-charge operation, the source side select gate line SGS may continue to be applied with the voltage $V_{SS}$, unchanged.

At timing t264 of the second pre-charge operation, the source line SL is applied with the voltage $V_{SRC}$, and the voltage $V_{SS}$ is raised to the voltage $V_{SRC}$. Note that at timing t264 of the second pre-charge operation, the source line SL may continue to be applied with the voltage $V_{SS}$, unchanged.

At timing t265 of the second pre-charge operation, the select gate line SGDstr1 representing a target of write by the second program operation is applied with the voltage $V_{SGD}$.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed. Specific operation is as in the equalize operation (discharging) described in the first-mode write operation with reference to FIG. 11.

Advantages

Although a binary value operation (SLC) where a binary value (1 bit) is held in the plurality of memory cells MC has a low degree of data integration, it enables a high-speed write operation and read operation, and has high reliability. The second-mode write operation, which is a write operation in which the first pre-charge operation and the first program operation are sequentially executed, and thereafter, the second pre-charge operation and the second program operation are sequentially executed, performs a write every page PG. In contrast, the first-mode write operation, which is a write operation in which the first pre-charge operation and the first program operation are sequentially executed, and uninterruptedly thereafter, the second program operation is executed, performs the writes of two pages PG uninterruptedly one after the other. Thus, by times of the equalize operation and the second pre-charge operation that had been performed between the first program operation and the second program operation in the second-mode write operation being consolidated into times of the first pre-charge operation before the first program operation and the recovery operation after the first program operation in the first-mode write operation, and by time for performing the write operation thereby being shortened, it is possible to provide a semiconductor memory device capable of high-speed operation.

Modified Example 1 of First Embodiment

In the above-mentioned first embodiment, in the first pre-charge operation executed in the first-mode write operation and the second-mode write operation, the following pre-charges are performed, namely: a pre-charge of the bit lines $BL_n$ that are to be the bit lines $BL_P$ in the first program operation (a bit line pre-charge operation); and a pre-charge of channels of the plurality of memory cells MC (a channel pre-charge operation). Moreover, the channel pre-charge operation is performed from both a drain side select gate line SGD side and a source side select gate line SGS side. In contrast, in the present modified example, in the first pre-charge operation, the channel pre-charge operation is performed from the drain side select gate line SGD side.

First-Mode Write Operation

Next, a first-mode write operation according to the present modified example will be described with reference to FIG. 13. In the first-mode write operation according to the present modified example, too, a binary value (1 bit) is held in the plurality of memory cells MC.

Figure 13:
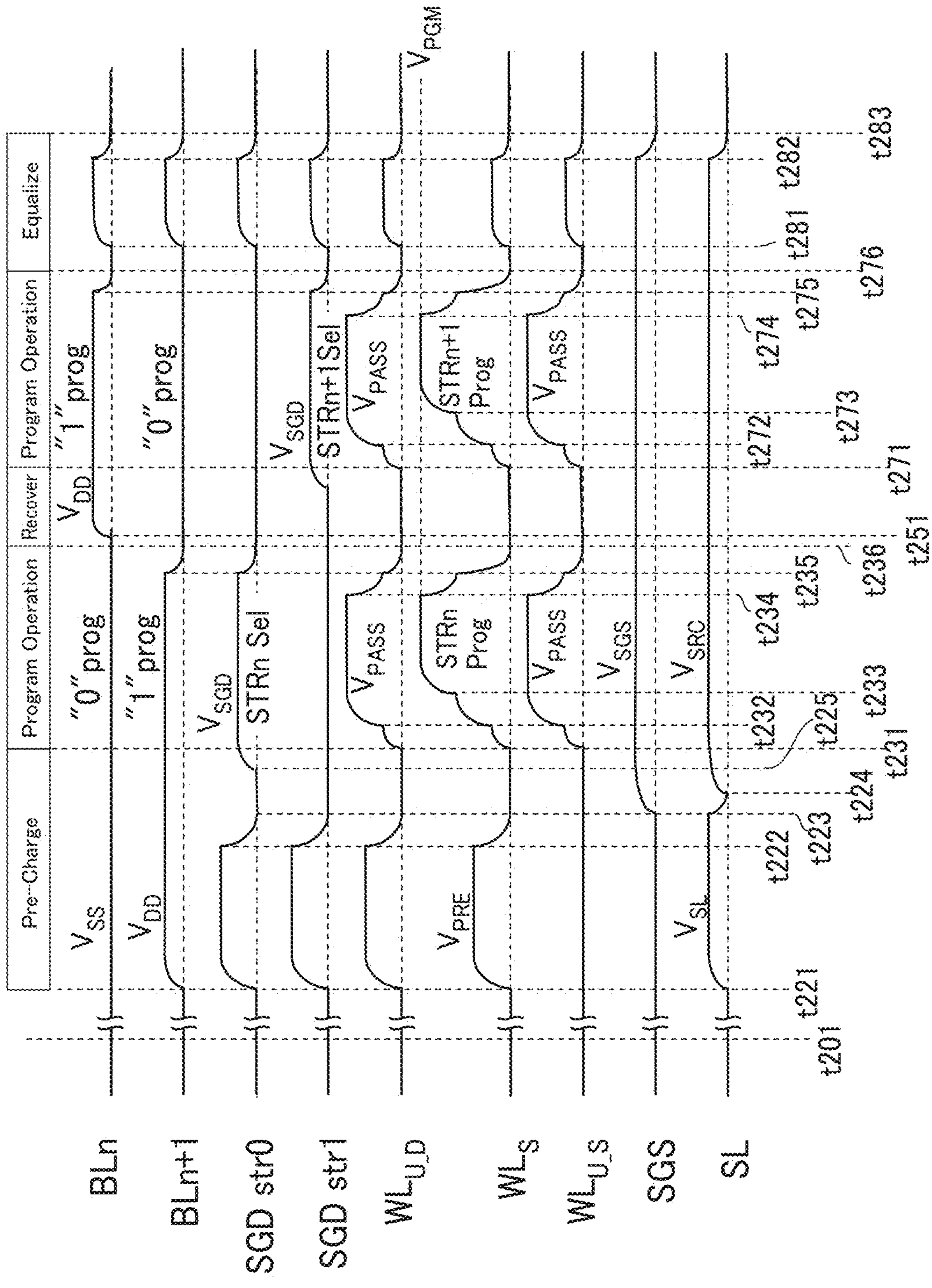
FIG. 13 is a timing chart for explaining a first-mode write operation according to modified example 1.

FIG. 13 is a timing chart for explaining the first-mode write operation according to modified example 1.

From timing t221 to timing t231, the first pre-charge operation in which target wirings are pre-charged by being applied with certain voltages, is executed.

At timing t221 of the first pre-charge operation, for example, the bit lines $BL_n$ that are to be the bit lines $BL_W$ in the first program operation are applied with the voltage $V_{SS}$, the bit lines $BL_{n+1}$ that are to be the bit lines $BL_P$ in the first program operation are applied with the voltage $V_{DD}$, and the source line SL is applied with the voltage $V_{SL}$. Moreover, the select gate lines SGDstr0, SGDstr1, the selected word line $WL_S$, and the drain side unselected word lines $WL_{U\_D}$ are applied with the voltage $V_{PRE}$, and the voltage $V_{SS}$ is raised to the voltage $V_{PRE}$. Note that the source side unselected word lines $WL_{U\_S}$ and the source side select gate line SGS are applied with the voltage $V_{SS}$. Thus, the channel pre-charge operation is performed from the drain side select gate line SGD side.

At timing t222 of the first pre-charge operation, the select gate lines SGDstr0, SGDstr1, the selected word line $WL_S$, and the drain side unselected word lines $WL_{U\_D}$ are applied with the voltage $V_{SS}$, and the voltage $V_{PRE}$ is lowered to the voltage $V_{SS}$. From timing t223 to timing t225 of the first pre-charge operation is as in the first pre-charge operation described in the first-mode write operation with reference to FIG. 11.

From timing t231 to timing t236, the first program operation is executed. Specific operation is as in the first program operation described in the first-mode write operation with reference to FIG. 11.

From timing t236 to timing t271 after the first program operation and before the second program operation, the recovery operation is executed. Specific operation is as in the recovery operation described in the first-mode write operation with reference to FIG. 11.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed.

Specific operation is as in the equalize operation (discharging) described in the first-mode write operation with reference to FIG. 11.

Second-Mode Write Operation

Next, a second-mode write operation according to the present modified example will be described with reference to FIG. 14. In the second-mode write operation according to the present modified example, too, a binary value (1 bit) is held in the plurality of memory cells MC.

Figure 14:
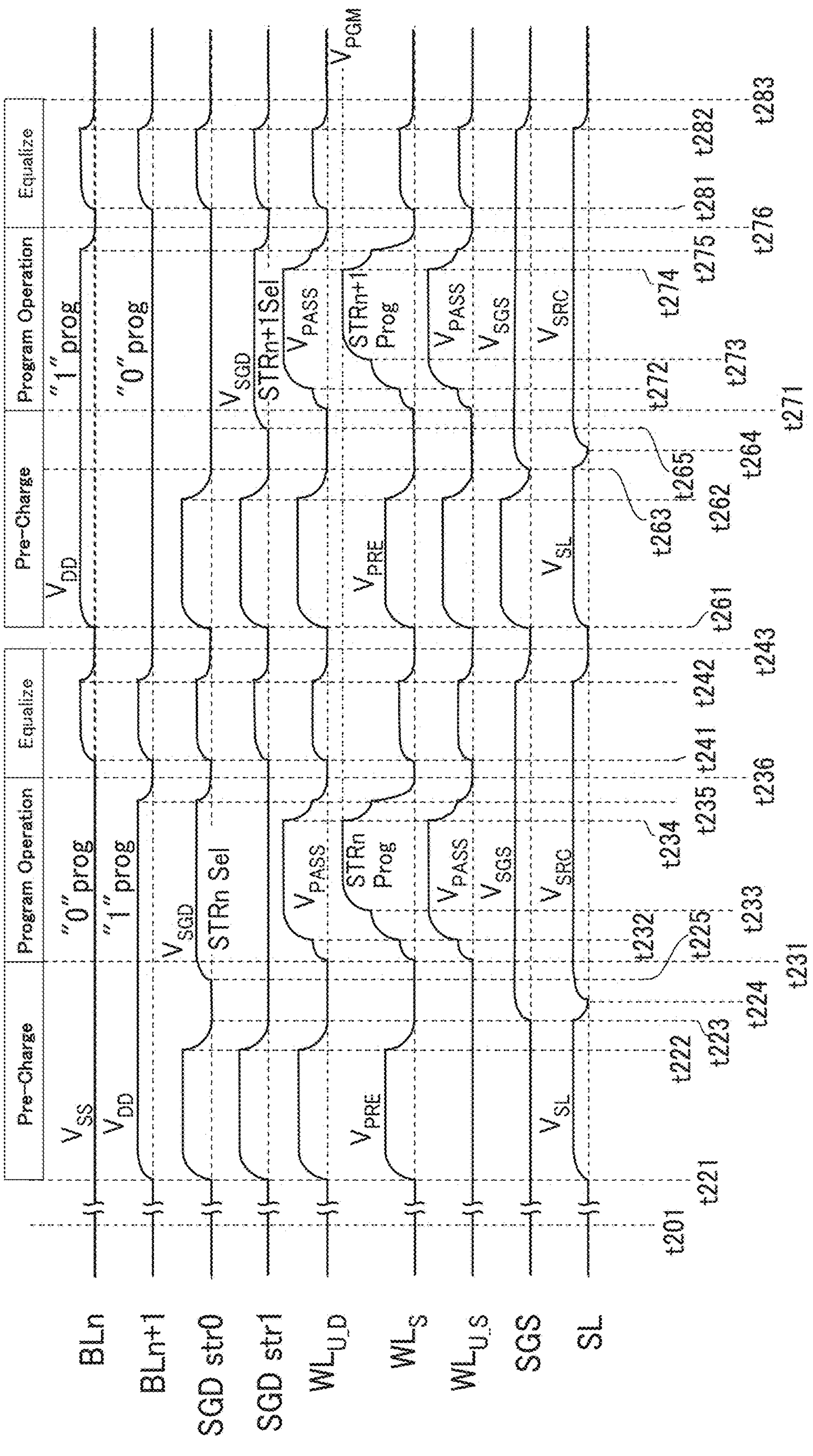
FIG. 14 is a timing chart for explaining a second-mode write operation according to modified example 1.

FIG. 14 is a timing chart for explaining the second-mode write operation according to modified example 1.

From timing t221 to timing t231, the first pre-charge operation in which target wirings are pre-charged by being applied with certain voltages, is executed. Specific operation is as in the first pre-charge operation described in the first-mode write operation according to the present modified example with reference to FIG. 13.

From timing t231 to timing t236, the first program operation is executed. Specific operation is as in the first program operation described in the first-mode write operation with reference to FIG. 11.

From timing t236 to timing t243 after the first program operation, the equalize operation (discharging) is executed. Specific operation is as in the equalize operation (discharging) described in the second-mode write operation with reference to FIG. 12.

From timing t261 to timing t271, the second pre-charge operation in which target wirings are pre-charged by being applied with certain voltages, is executed. Specific operation is as in the second pre-charge operation described in the second-mode write operation with reference to FIG. 12.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed. Specific operation is as in the equalize operation (discharging) described in the first-mode write operation with reference to FIG. 11.

Modified Example 2 of First Embodiment

In the above-mentioned first embodiment, in the first pre-charge operation executed in the first-mode write operation and the second-mode write operation, the channel pre-charge operation is performed from both the drain side select gate line SGD side and the source side select gate line SGS side. In contrast, in the present modified example, in the first pre-charge operation, the channel pre-charge operation is performed from the source side select gate line SGS side.

First-Mode Write Operation

Next, a first-mode write operation according to the present modified example will be described with reference to FIG. 15. In the first-mode write operation according to the present modified example, too, a binary value (1 bit) is held in the plurality of memory cells MC.

Figure 15:
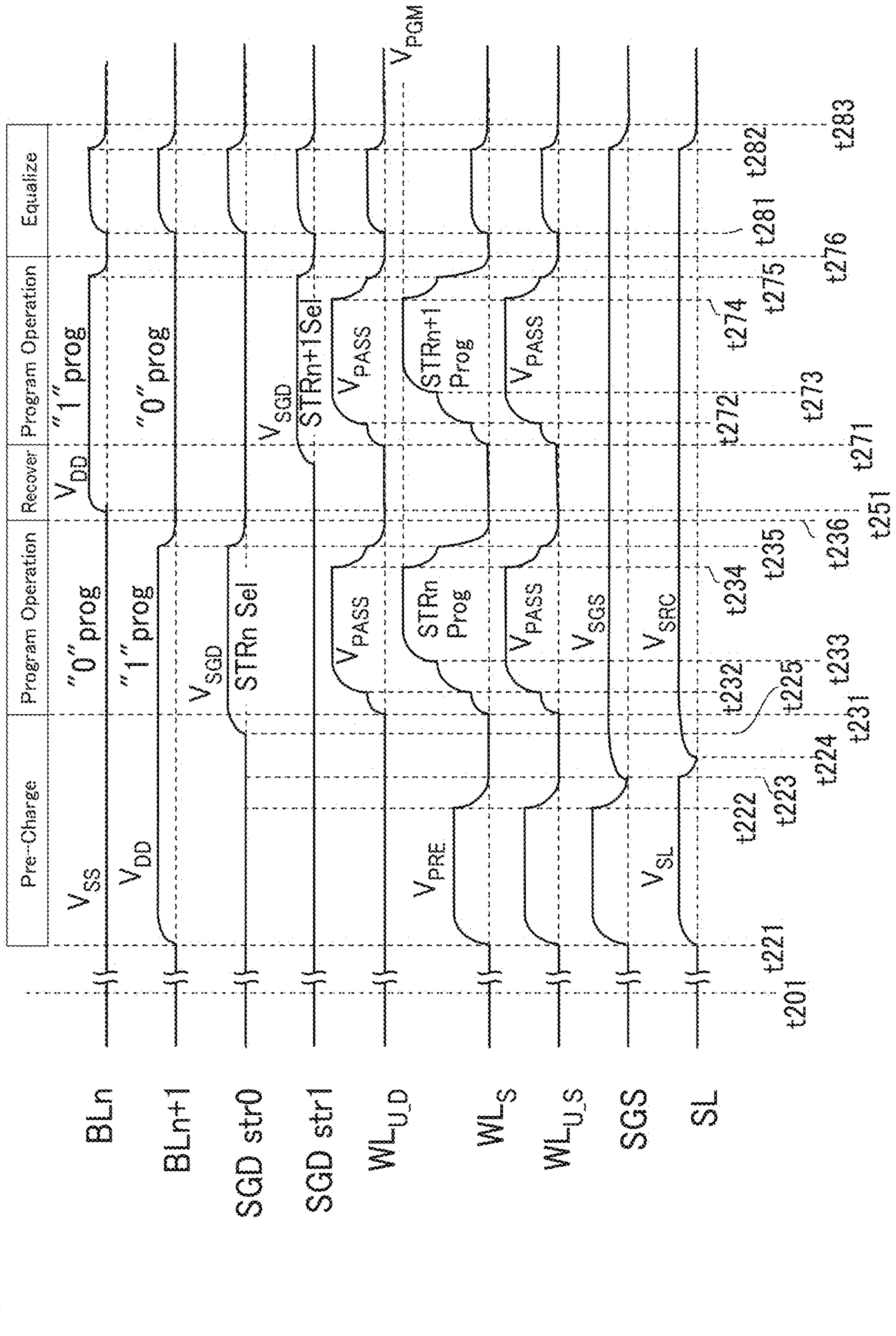
FIG. 15 is a timing chart for explaining a first-mode write operation according to modified example 2.

FIG. 15 is a timing chart for explaining the first-mode write operation according to modified example 2.

From timing t221 to timing t231, the first pre-charge operation in which target wirings are pre-charged by being applied with certain voltages, is executed.

At timing t221 of the first pre-charge operation, for example, the bit lines $BL_n$ that are to be the bit lines $BL_W$ in the first program operation are applied with the voltage $V_{SS}$, the bit lines $BL_{n+1}$ that are to be the bit lines $BL_P$ in the first program operation are applied with the voltage $V_{DD}$, and the source line SL is applied with the voltage $V_{SL}$. Moreover, the selected word line $WL_S$, the source side unselected word lines $WL_{U\_S}$, and the source side select gate line SGS are applied with the voltage $V_{PRE}$, and the voltage $V_{SS}$ is raised to the voltage $V_{PRE}$. Note that the select gate lines SGDstr0, SGDstr1, and the drain side unselected word lines $WL_{U\_D}$ are applied with the voltage $V_{SS}$. Thus, the channel pre-charge operation is performed from the source side select gate line SGS side.

At timing t222 of the first pre-charge operation, the selected word line $WL_S$, the source side unselected word lines $WL_{U\_S}$, and the source side select gate line SGS are applied with the voltage $V_{SS}$, and the voltage $V_{PRE}$ is lowered to the voltage $V_{SS}$.

From timing t223 to timing t225 of the first pre-charge operation is as in the first pre-charge operation described in the first-mode write operation with reference to FIG. 11.

From timing t231 to timing t236, the first program operation is executed. Specific operation is as in the first program operation described in the first-mode write operation with reference to FIG. 11.

From timing t236 to timing t271 after the first program operation and before the second program operation, the recovery operation is executed. Specific operation is as in the recovery operation described in the first-mode write operation with reference to FIG. 11.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed. Specific operation is as in the equalize operation (discharging) described in the first-mode write operation with reference to FIG. 11.

Second-Mode Write Operation

Next, a second-mode write operation according to the present modified example will be described with reference to FIG. 16. In the second-mode write operation according to the present modified example, too, a binary value (1 bit) is held in the plurality of memory cells MC.

Figure 16:
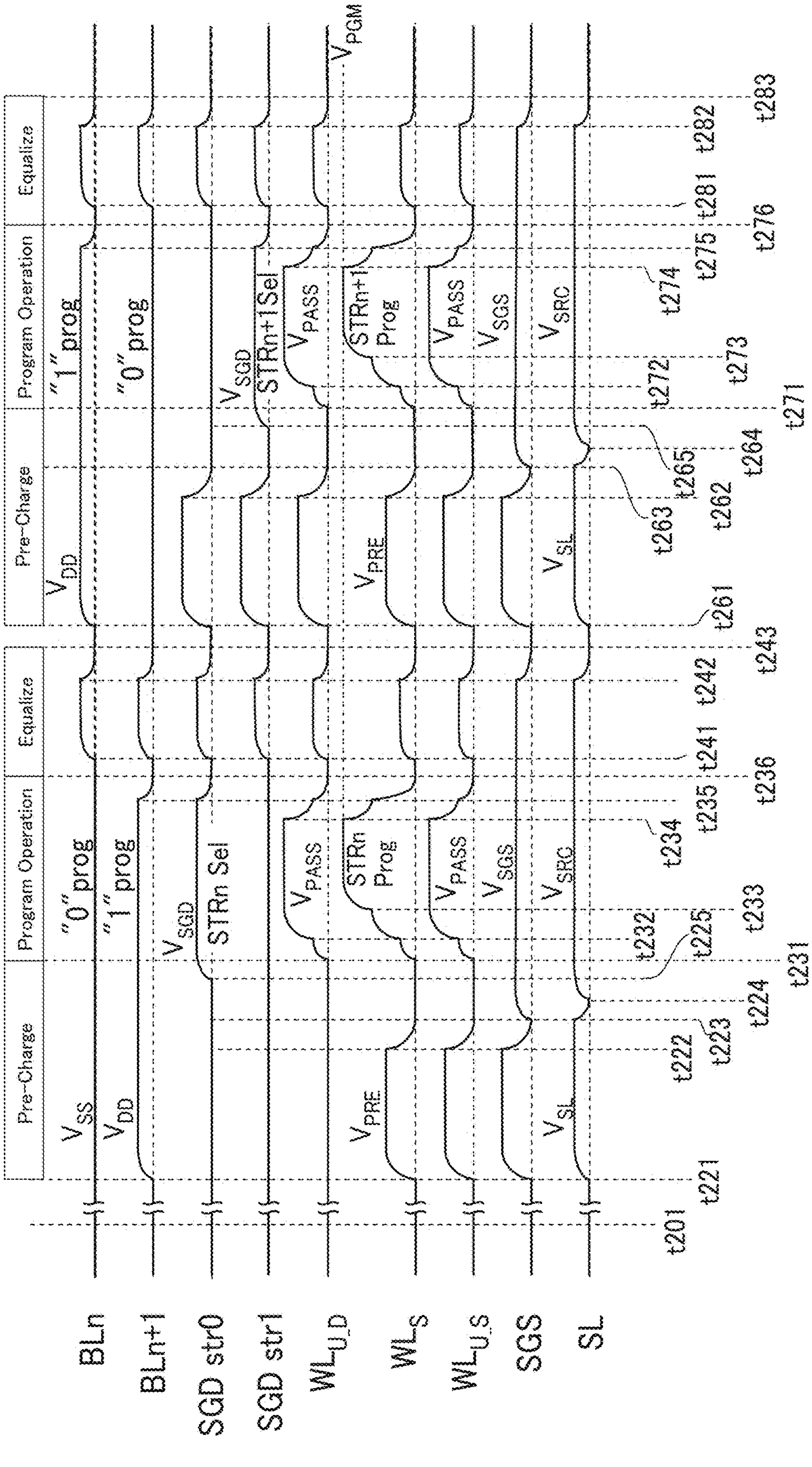
FIG. 16 is a timing chart for explaining a second-mode write operation according to modified example 2.

FIG. 16 is a timing chart for explaining the second-mode write operation according to modified example 2.

From timing t221 to timing t231, the first pre-charge operation in which target wirings are pre-charged by being applied with certain voltages, is executed. Specific operation is as in the first pre-charge operation described in the first-mode write operation according to the present modified example with reference to FIG. 15.

From timing t231 to timing t236, the first program operation is executed. Specific operation is as in the first program operation described in the first-mode write operation with reference to FIG. 11.

From timing t236 to timing t243 after the first program operation, the equalize operation (discharging) is executed. Specific operation is as in the equalize operation (discharging) described in the second-mode write operation with reference to FIG. 12.

From timing t261 to timing t271, the second pre-charge operation in which target wirings are pre-charged by being applied with certain voltages, is executed. Specific operation is as in the second pre-charge operation described in the second-mode write operation with reference to FIG. 12.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed.

Specific operation is as in the equalize operation (discharging) described in the first-mode write operation with reference to FIG. 11.

Modified Example 3 of First Embodiment

The write operation according to the first embodiment may include a verify operation, in addition to the pre-charge operation, the program operation, and the equalize operation. The verify operation, which is an operation executed later than the program operation, is an operation that confirms whether or not data has been appropriately written to each memory cell MC within the page PG. In the present modified example, cases of the verify operation being performed in the first-mode write operation and the second-mode write operation will be described exemplifying the case where in the first pre-charge operation, the channel pre-charge operation is performed from the source side select gate line SGS side.

First-Mode Write Operation

Next, a first-mode write operation according to the present modified example will be described with reference to FIG. 17. In the first-mode write operation according to the present modified example, too, a binary value (1 bit) is held in the plurality of memory cells MC.

Figure 17:
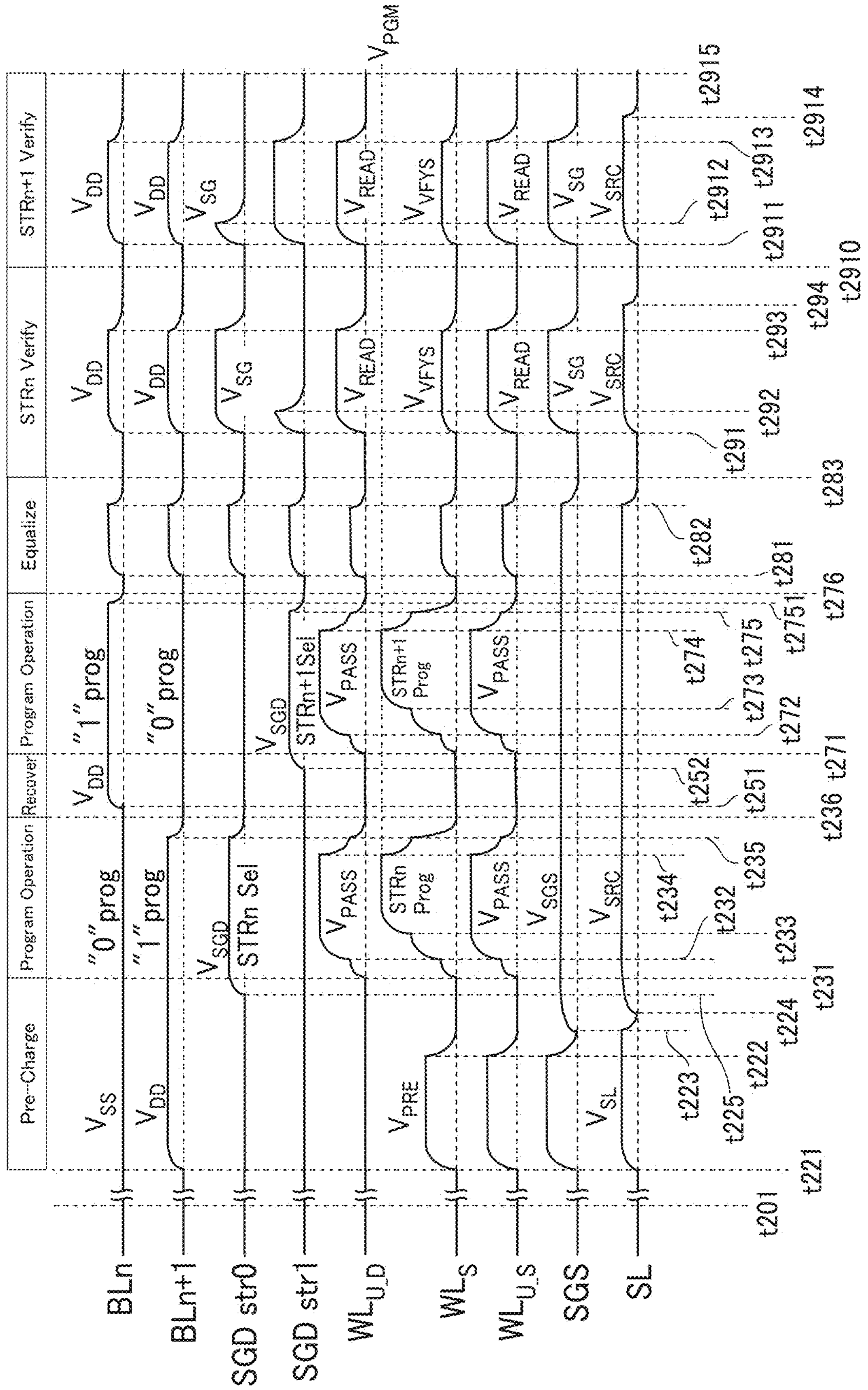
FIG. 17 is a timing chart for explaining a first-mode write operation according to modified example 3.

FIG. 17 is a timing chart for explaining the first-mode write operation according to modified example 3.

From timing t221 to timing t231, the first pre-charge operation in which target wirings are pre-charged by being applied with certain voltages, is executed. Specific operation is as in the first pre-charge operation described in the first-mode write operation with reference to FIG. 15.

From timing t231 to timing t236, the first program operation is executed. Specific operation is as in the first program operation described in the first-mode write operation with reference to FIG. 11.

From timing t236 to timing t271 after the first program operation and before the second program operation, the recovery operation is executed. Specific operation is as in the recovery operation described in the first-mode write operation with reference to FIG. 11.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed. Specific operation is as in the equalize operation (discharging) described in the first-mode write operation with reference to FIG. 11.

From timing t283 to timing t2910, a first verify operation is executed.

At timing t291 of the first verify operation, the select gate line SGDstr0, the select gate line SGDstr1, and the source side select gate line SGS are applied with a voltage $V_{SG}$. The voltage $V_{SG}$ has a magnitude of a degree that the select transistors (STD, STS) attain an ON state. Moreover, the drain side unselected word lines $WL_{U\_D}$ and the source side unselected word lines $WL_{U\_S}$ are applied with the read pass voltage $V_{READ}$ (FIG. 7). Moreover, the selected word line $WL_S$ is applied with the voltage $V_{VFYS}$ (FIG. 7) (a fourth voltage). Moreover, the bit lines $BL_n$ and the bit lines $BL_{n+1}$ are applied with the voltage $V_{DD}$, and the source line SL is applied with the voltage $V_{SRC}$.

At timing t292 of the first verify operation, the select gate line SGDstr1 is applied with the voltage $V_{SS}$, and the voltage $V_{SG}$ of the select gate line SGDstr1 is lowered to the voltage $V_{SS}$.

At timings t292 to t293 of the first verify operation, a sense operation is executed. In the sense operation, the sense node SEN described with reference to FIG. 4 is electrically continuous with the bit line BL. A charge of the sense node SEN connected to a memory cell MC in an ON state is discharged, and the sense transistor 41 connected to this sense node SEN attains an OFF state. On the other hand, a charge of the sense node SEN connected to a memory cell MC in an OFF state is maintained, and the sense transistor 41 connected to this sense node SEN attains an ON state. When, in this kind of state, the signal line STB is set to an ON state, data indicating whether the memory cell MC is in an ON state or is in an OFF state will be transferred to the wiring LBUS. It is possible for this data to be latched by any one of the latch circuits SDL, DL0 to DLn.

At timing t293 of the first verify operation, the bit lines $BL_n$, the bit lines $BL_{n+1}$, the select gate line SGDstr0, the select gate line SGDstr1, the drain side unselected word lines $WL_{U\_D}$, the selected word line $WL_S$, the source side unselected word lines $WL_{U\_S}$, and the source side select gate line SGS are applied with the voltage $V_{SS}$, and the voltages of the bit lines $BL_n$, the bit lines $BL_{n+1}$, the select gate line SGDstr0, the select gate line SGDstr1, the drain side unselected word lines $WL_{U\_D}$, the selected word line $WL_S$, the source side unselected word lines $WL_{U\_S}$, and the source side select gate line SGS are lowered to the voltage $V_{SS}$.

At timing t294 of the first verify operation, the source line SL is applied with the voltage $V_{SS}$, and the voltage $V_{SRC}$ of the source line SL is lowered to the voltage $V_{SS}$.

From timing t2910 to timing t2915, a second verify operation is executed.

At timing t2911 of the second verify operation, the select gate line SGDstr0, the select gate line SGDstr1, and the source side select gate line SGS are applied with the voltage $V_{SG}$. Moreover, the drain side unselected word lines $WL_{U\_D}$ and the source side unselected word lines $WL_{U\_S}$ are applied with the read pass voltage $V_{READ}$ (FIG. 7). Moreover, the selected word line $WL_S$ is applied with the voltage $V_{VFYS}$ (the fourth voltage). Moreover, the bit lines BL, and the bit lines $BL_{n+1}$ are applied with the voltage $V_{DD}$, and the source line SL is applied with the voltage $V_{SRC}$.

At timing t2912 of the second verify operation, the select gate line SGDstr0 is applied with the voltage $V_{SS}$, and the voltage $V_{SG}$ of the select gate line SGDstr0 is lowered to the voltage $V_{SS}$.

At timings t2912 to t2913 of the second verify operation, the sense operation is executed.

At timing t2913 of the second verify operation, the bit lines $BL_n$, the bit lines $BL_{n+1}$, the select gate line SGDstr0, the select gate line SGDstr1, the drain side unselected word lines $WL_{U\_D}$, the selected word line $WL_S$, the source side unselected word lines $WL_{U\_S}$, and the source side select gate line SGS are applied with the voltage $V_{SS}$, and the voltages of the bit lines $BL_n$, the bit lines $BL_{n+1}$, the select gate line SGDstr0, the select gate line SGDstr1, the drain side unselected word lines $WL_{U\_D}$, the selected word line $WL_S$, the source side unselected word lines $WL_{U\_S}$, and the source side select gate line SGS are lowered to the voltage $V_{SS}$.

At timing t2914 of the second verify operation, the source line SL is applied with the voltage $V_{SS}$, and the voltage $V_{SRC}$ of the source line SL is lowered to the voltage $V_{SS}$.

Second-Mode Write Operation

Next, a second-mode write operation according to the present modified example will be described with reference to FIG. 18. In the second-mode write operation according to the present modified example, too, a binary value (1 bit) is held in the plurality of memory cells MC.

Figure 18:
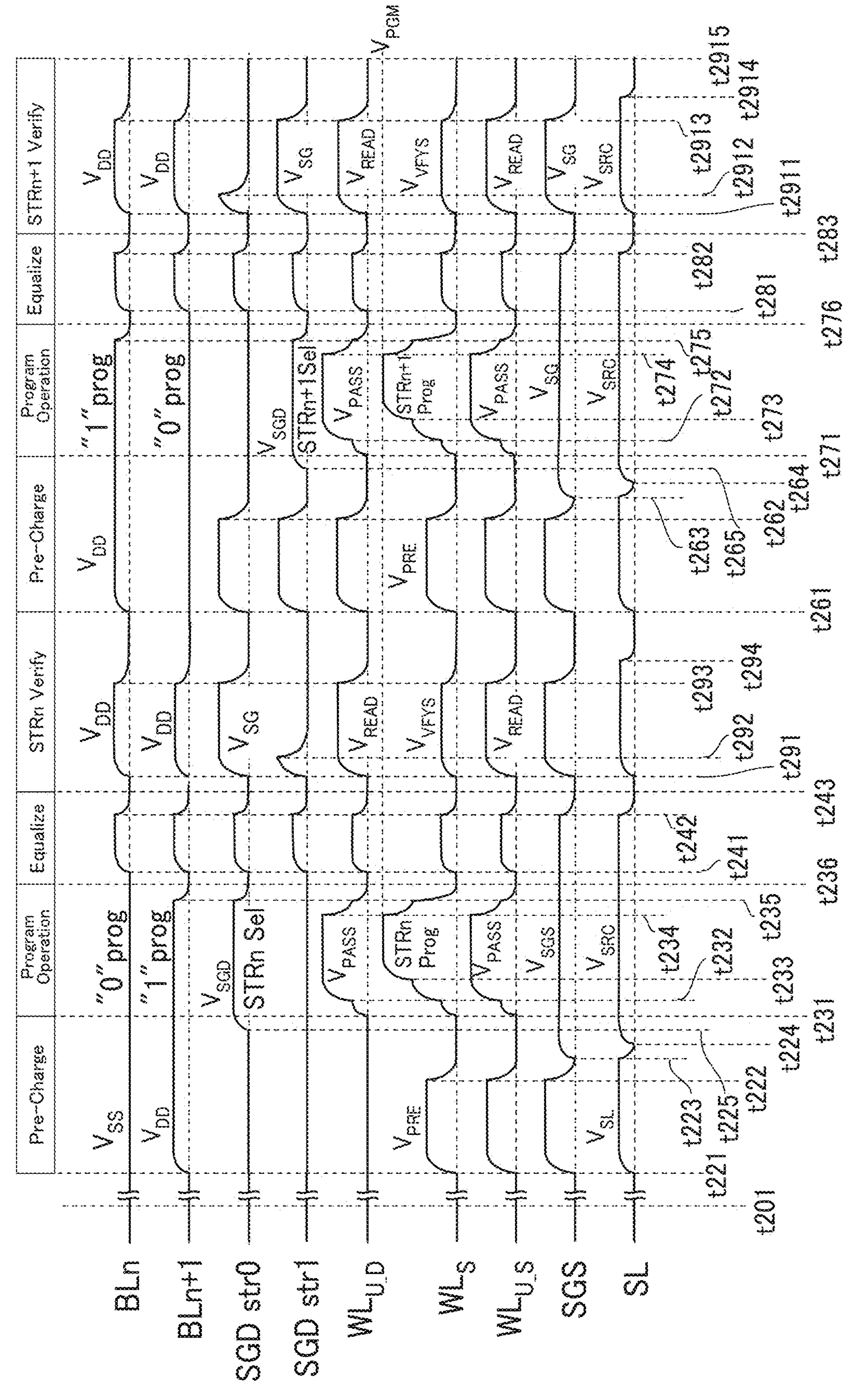
FIG. 18 is a timing chart for explaining a second-mode write operation according to modified example 3.

FIG. 18 is a timing chart for explaining the second-mode write operation according to modified example 3.

From timing t221 to timing t231, the first pre-charge operation in which target wirings are pre-charged by being applied with certain voltages, is executed. Specific operation is as in the first pre-charge operation described in the first-mode write operation according to the present modified example with reference to FIG. 15.

From timing t231 to timing t236, the first program operation is executed. Specific operation is as in the first program operation described in the first-mode write operation with reference to FIG. 11.

From timing t236 to timing t243 after the first program operation, the equalize operation (discharging) is executed. Specific operation is as in the equalize operation (discharging) described in the second-mode write operation with reference to FIG. 12.

From timing t243 to timing t261, the first verify operation is executed. Specific operation is as described in the first verify operation with reference to FIG. 17.

From timing t261 to timing t271, the second pre-charge operation in which target wirings are pre-charged by being applied with certain voltages, is executed. Specific operation is as in the second pre-charge operation described in the second-mode write operation with reference to FIG. 12.

From timing t271 to timing t276, the second program operation is executed. Specific operation is as in the second program operation described in the first-mode write operation with reference to FIG. 11.

From timing t276 to timing t283 after the second program operation, the equalize operation (discharging) is executed. Specific operation is as in the equalize operation (discharging) described in the first-mode write operation with reference to FIG. 11.

From timing t283 to timing t2915, the second verify operation is executed. Specific operation is as described in the second verify operation with reference to FIG. 17.

Second Embodiment

Although in the above-mentioned first embodiment, the case is described where the writes of two pages PG are performed uninterruptedly one after the other in the first-mode write operation, it is possible too for writes of three or more pages PG to be performed uninterruptedly one after another in a first-mode write operation. In the present embodiment, the case will be described where writes of four pages PG are performed uninterruptedly one after another in a first-mode write operation.

Note that when executing the write operation, for example, data corresponding to three or more pages PG may be priorly held in three or more of the latch circuits DL0 to DLn (FIG. 4). Moreover, during execution of the write operation, data in the latch circuits DL0 to DLn may be updated, and the program operation may be executed using the updated data.

First-Mode Write Operation

Figure 19:
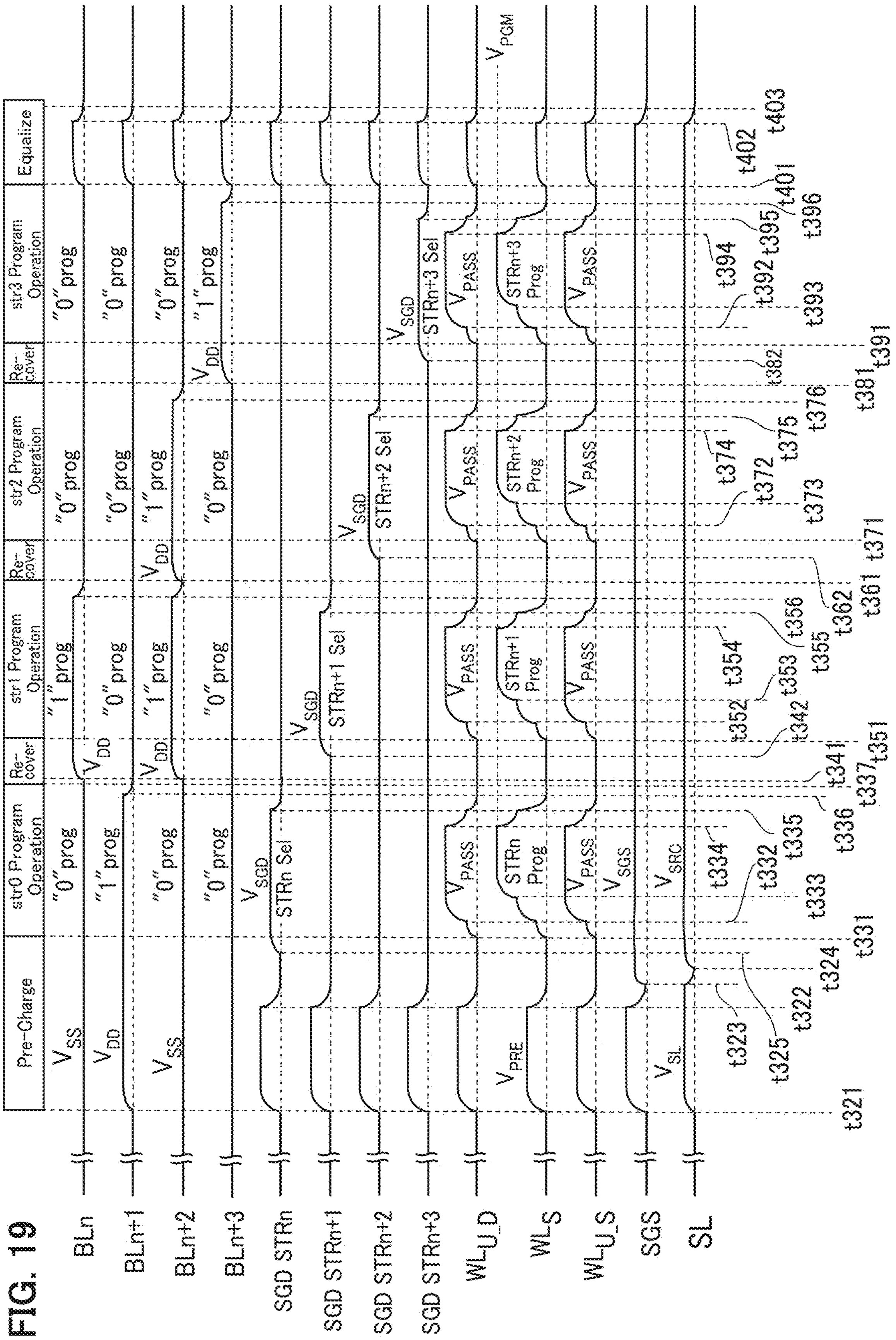
FIG. 19 is a timing chart for explaining a first-mode write operation according to a second embodiment.

Next, a first-mode write operation according to the present embodiment will be described with reference to FIG. 19. In the first-mode write operation according to the present embodiment, too, a binary value (1 bit) is held in the plurality of memory cells MC. FIG. 19 is a timing chart for explaining the first-mode write operation according to the second embodiment. In FIG. 19, the drain side select gate lines SGD of differing four string units SU within one memory block BLK will be referred to as select gate lines SGD STRn, SGD STRn+1, SGD STRn+2, SGD STRn+3. The select gate line SGD STRn is the select gate line SGD representing a target of write by an str0 program operation. The select gate line SGD STRn+1 is the select gate line SGD representing a target of write by an str1 program operation. The select gate line SGD STRn+2 is the select gate line SGD representing a target of write by an str2 program operation. The select gate line SGD STRn+3 is the select gate line SGD representing a target of write by an str3 program operation.

From timing t321 to timing t331, the first pre-charge operation in which target wirings are pre-charged by being applied with certain voltages, is executed.

At timing t321 of the first pre-charge operation, for example, a bit line $BL_n$, a bit line $BL_{n+2}$, and a bit line $BL_{n+3}$ that are to be the bit line $BL_W$ in the str0 program operation are applied with the voltage $V_{SS}$ (the second voltage), a bit line $BL_{n+1}$ that is to be the bit line $BL_P$ in the str0 program operation is applied with the voltage $V_{DD}$ (the fourth voltage), and the source line SL is applied with the voltage $V_{SL}$. Moreover, the select gate lines SGD STRn, SGD STRn+1, SGD STRn+2, SGD STRn+3, the drain side unselected word lines $WL_{U\_D}$, the selected word line $WL_S$, the source side unselected word lines $WL_{U\_S}$, and the source side select gate line SGS are applied with the voltage $V_{PRE}$, and the voltage $V_{SS}$ is raised to the voltage $V_{PRE}$. Thus, the channel pre-charge operation is performed from both the drain side select gate line SGD side and the source side select gate line SGS side.

At timing t322 of the first pre-charge operation, the select gate lines SGD STRn, SGD STRn+1, SGD STRn+2, SGD STRn+3, the drain side unselected word lines $WL_{U\_D}$, the selected word line $WL_S$, the source side unselected word lines $WL_{U\_S}$, and the source side select gate line SGS are applied with the voltage $V_{SS}$, and the voltage $V_{PRE}$ is lowered to the voltage $V_{SS}$.

At timing t323 of the first pre-charge operation, the source line SL is applied with the voltage $V_{SS}$, and the voltage $V_{SL}$ is lowered to the voltage $V_{SS}$. Moreover, the source side select gate line SGS is applied with the voltage $V_{SGS}$, and the voltage $V_{SS}$ is raised to the voltage $V_{SGS}$. Note that at timing t323 of the first pre-charge operation, the source side select gate line SGS may continue to be applied with the voltage $V_{SS}$, unchanged.

At timing t324 of the first pre-charge operation, the source line SL is applied with the voltage $V_{SRC}$, and the voltage $V_{SS}$ is raised to the voltage $V_{SRC}$. Note that at timing t324 of the first pre-charge operation, the source line SL may continue to be applied with the voltage $V_{SS}$, unchanged.

At timing t325 of the first pre-charge operation, the select gate line SGD STRn representing a target of write by the str0 program operation is applied with the voltage $V_{SGD}$.

From timing t331 to timing t337, the str0 program operation is executed.

At timing t331 of the str0 program operation, for example, the bit line $BL_{n+1}$ that is to be the bit line $BL_P$ in the str0 program operation is applied with the voltage $V_{DD}$, the bit line $BL_n$, the bit line $BL_{n+2}$, and the bit line $BL_{n+3}$ that are to be the bit line $BL_W$ in the str0 program operation are applied with the voltage $V_{SS}$, the select gate line SGD STRn is applied with the voltage $V_{SGD}$, and the select gate lines SGD STRn+1, SGD STRn+2, and SGD STRn+3 are applied with the voltage $V_{SS}$. Moreover, at timing t331 of the str0 program operation, the selected word line $WL_S$, the drain side unselected word lines $WL_{U\_D}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t332 of the str0 program operation, the selected word line $WL_S$, the drain side unselected word lines $WL_{U\_D}$, and the source side unselected word lines $WL_{U\_S}$ are applied with the write pass voltage $V_{PASS}$.

At timing t333 of the str0 program operation, the selected word line $WL_S$ is applied with an str0 program voltage $V_{PGM}$.

At timing t334 of the str0 program operation, the selected word line $WL_S$ is applied with the write pass voltage $V_{PASS}$ and the str0 program voltage $V_{PGM}$ is lowered to the write pass voltage $V_{PASS}$, and the drain side unselected word lines $WL_{U\_D}$ and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t335 of the str0 program operation, the select gate line SGD STRn, the selected word line $WL_S$, the drain side unselected word lines $WL_{U\_D}$, and the source side unselected word lines $WL_{U\_S}$ are applied with the voltage $V_{SS}$, and the voltage $V_{SGD}$ of the select gate line SGD STRn, the write pass voltage $V_{PASS}$ of the selected word line $WL_S$, and the voltage $V_{DD}$-$V_{th}$ of the drain side unselected word lines $WL_{U\_D}$ and the source side unselected word lines $WL_{U\_S}$ are lowered to the voltage $V_{SS}$.

At timing t336 of the str0 program operation, the bit line $BL_{n+1}$ is applied with the voltage $V_{SS}$, and the voltage $V_{DD}$ of the bit line $BL_{n+1}$ is lowered to the voltage $V_{SS}$.

From timing t337 to timing t351 after the str0 program operation and before the str1 program operation, the recovery operation is executed.

At timing t341 of the recovery operation, the bit line $BL_n$ and the bit line $BL_{n+2}$ that are to be the bit line $BL_P$ in the str1 program operation are applied with the voltage $V_{DD}$ as a recovery voltage.

At timing t342 of the recovery operation, the select gate line SGD STRn+1 representing a target of write by the str1 program operation is applied with the voltage $V_{SGD}$.

From timing t351 to timing t361, the str1 program operation is executed.

At timing t351 of the str1 program operation, for example, the bit line $BL_n$ and the bit line $BL_{n+2}$ that are to be the bit line $BL_P$ in the str1 program operation are applied with the voltage $V_{DD}$, the bit line $BL_{n+1}$ and the bit line $BL_{n+3}$ that are to be the bit line $BL_W$ in the str1 program operation are applied with the voltage $V_{SS}$, the select gate line SGD STRn+1 is applied with the voltage $V_{SGD}$, and the select gate lines SGD STRn, SGD STRn+2, and SGD STRn+3 are applied with the voltage $V_{SS}$. Moreover, at timing t351 of the str1 program operation, the selected word line $WL_S$, the drain side unselected word lines $WL_{U\_D}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t352 of the str1 program operation, the selected word line $WL_S$, the drain side unselected word lines $WL_{U\_D}$, and the source side unselected word lines $WL_{U\_S}$ are applied with the write pass voltage $V_{PASS}$.

At timing t353 of the str1 program operation, the selected word line $WL_S$ is applied with an str1 program voltage $V_{PGM}$. Note that the str0 program voltage $V_{PGM}$ and the str1 program voltage $V_{PGM}$ are different voltages, but may be the same voltage.

At timing t354 of the str1 program operation, the selected word line $WL_S$ is applied with the write pass voltage $V_{PASS}$ and the str1 program voltage $V_{PGM}$ is lowered to the write pass voltage $V_{PASS}$, and the drain side unselected word lines $WL_{U\_D}$ and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t355 of the str1 program operation, the select gate line SGD STRn+1, the selected word line $WL_S$, the drain side unselected word lines $WL_{U\_D}$, and the source side unselected word lines $WL_{U\_S}$ are applied with the voltage $V_{SS}$, and the voltage $V_{SGD}$ of the select gate line SGD STRn+1, the write pass voltage $V_{PASS}$ of the selected word line $WL_S$, and the voltage $V_{DD}$-$V_{th}$ of the drain side unselected word lines $WL_{U\_D}$ and the source side unselected word lines $WL_{U\_S}$ are lowered to the voltage $V_{SS}$.

At timing t356 of the str1 program operation, the bit line $BL_n$ and the bit line $BL_{n+2}$ are applied with the voltage $V_{SS}$, and the voltage $V_{DD}$ of the bit line $BL_n$ and the bit line $BL_{n+2}$ is lowered to the voltage $V_{SS}$.

From timing t361 to timing t371 after the str1 program operation and before the str2 program operation, the recovery operation is executed.

At timing t361 of the recovery operation, the bit line $BL_{n+2}$ that is to be the bit line $BL_P$ in the str2 program operation is applied with the voltage $V_{DD}$ as a recovery voltage.

At timing t362 of the recovery operation, the select gate line SGD STRn+2 representing a target of write by the str2 program operation is applied with the voltage $V_{SGD}$.

From timing t371 to timing t381, the str2 program operation is executed.

At timing t371 of the str2 program operation, for example, the bit line $BL_{n+2}$ that is to be the bit line $BL_P$ in the str2 program operation is applied with the voltage $V_{DD}$ (the first voltage), the bit line $BL_n$ the bit line $BL_{n+1}$, and the bit line $BL_{n+3}$ that are to be the bit line $BL_W$ in the str2 program operation are applied with the voltage $V_{SS}$, the select gate line SGD STRn+2 is applied with the voltage $V_{SGD}$, and the select gate lines SGD STRn, SGD STRn+1, and SGD STRn+3 are applied with the voltage $V_{SS}$. Moreover, at timing t371 of the str2 program operation, the selected word line $WL_S$, the drain side unselected word lines $WL_{U\_D}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t372 of the str2 program operation, the selected word line $WL_S$, the drain side unselected word lines $WL_{U\_D}$, and the source side unselected word lines $WL_{U\_S}$ are applied with the write pass voltage $V_{PASS}$.

At timing t373 of the str2 program operation, the selected word line $WL_S$ is applied with an str2 program voltage $V_{PGM}$. Note that the str1 program voltage $V_{PGM}$ and the str2 program voltage $V_{PGM}$ are different voltages, but may be the same voltage.

At timing t374 of the str2 program operation, the selected word line $WL_S$ is applied with the write pass voltage $V_{PASS}$ and the str2 program voltage $V_{PGM}$ is lowered to the write pass voltage $V_{PASS}$, and the drain side unselected word lines $WL_{U\_D}$ and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t375 of the str2 program operation, the select gate line SGD STRn+2, the selected word line $WL_S$, the drain side unselected word lines $WL_{U\_D}$, and the source side unselected word lines $WL_{U\_S}$ are applied with the voltage $V_{SS}$, and the voltage $V_{SGD}$ of the select gate line SGD STRn+2, the write pass voltage $V_{PASS}$ of the selected word line $WL_S$, and the voltage $V_{DD}$-$V_{th}$ of the drain side unselected word lines $WL_{U\_D}$ and the source side unselected word lines $WL_{U\_S}$ are lowered to the voltage $V_{SS}$.

At timing t376 of the str2 program operation, the bit line $BL_{n+2}$ is applied with the voltage $V_{SS}$, and the voltage $V_{DD}$ of the bit line $BL_{n+2}$ is lowered to the voltage $V_{SS}$.

From timing t381 to timing t391 after the str2 program operation and before the str3 program operation, the recovery operation is executed.

At timing t381 of the recovery operation, the bit line $BL_{n+3}$ that is to be the bit line $BL_P$ in the str3 program operation is applied with the voltage $V_{DD}$ as a recovery voltage.

At timing t382 of the recovery operation, the select gate line SGD STRn+3 representing a target of write by the str3 program operation is applied with the voltage $V_{SGD}$.

From timing t391 to timing t401, the str3 program operation is executed.

At timing t391 of the str3 program operation, for example, the bit line $BL_{n+3}$ that is to be the bit line $BL_P$ in the str3 program operation is applied with the voltage $V_{DD}$ (the first voltage), the bit line $BL_n$, the bit line $BL_{n+1}$, and the bit line $BL_{n+2}$ that are to be the bit line $BL_W$ in the str3 program operation are applied with the voltage $V_{SS}$, the select gate line SGD STRn+3 is applied with the voltage $V_{SGD}$, and the select gate lines SGD STRn, SGD STRn+1, and SGD STRn+2 are applied with the voltage $V_{SS}$. Moreover, at timing t391 of the str3 program operation, the selected word line $WL_S$, the drain side unselected word lines $WL_{U\_D}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t392 of the str3 program operation, the selected word line $WL_S$, the drain side unselected word lines $WL_{U\_D}$, and the source side unselected word lines $WL_{U\_S}$ are applied with the write pass voltage $V_{PASS}$.

At timing t393 of the str3 program operation, the selected word line $WL_S$ is applied with an str3 program voltage $V_{PGM}$. Note that the str2 program voltage $V_{PGM}$ and the str3 program voltages $V_{PGM}$ are different voltages, but may be the same voltage.

At timing t394 of the str3 program operation, the selected word line $WL_S$ is applied with the write pass voltage $V_{PASS}$ and the str3 program voltage $V_{PGM}$ is lowered to the write pass voltage $V_{PASS}$, and the drain side unselected word lines $WL_{U\_D}$ and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t395 of the str3 program operation, the select gate line SGD STRn+3, the selected word line $WL_S$, the drain side unselected word lines $WL_{U\_D}$, and the source side unselected word lines $WL_{U\_S}$ are applied with the voltage $V_{SS}$, and the voltage $V_{SGD}$ of the select gate line SGD STRn+3, the write pass voltage $V_{PASS}$ of the selected word line $WL_S$, and the voltage $V_{DD}$-$V_{th}$ of the drain side unselected word lines $WL_{U\_D}$ and the source side unselected word lines $WL_{U\_S}$ are lowered to the voltage $V_{SS}$.

At timing t396 of the str3 program operation, the bit line $BL_{n+3}$ is applied with the voltage $V_{SS}$, and the voltage $V_{DD}$ of the bit line $BL_{n+3}$ is lowered to the voltage $V_{SS}$.

From timing t401 to timing t403 after the str3 program operation, the equalize operation (discharging) is executed.

At timing t401 of the equalize operation, the bit line $BL_n$ through the bit line $BL_{n+3}$, the select gate line SGD STRn through the select gate line SGD STRn+3, the selected word line $WL_S$, the drain side unselected word lines $WL_{U\_D}$, and the source side unselected word lines $WL_{U\_S}$ are applied with an open circuit voltage.

At timing t402 of the equalize operation, the bit line $BL_n$ through the bit line $BL_{n+3}$, the select gate line SGD STRn through the select gate line SGD STRn+3, the selected word line $WL_S$, the drain side unselected word lines $WL_{U\_D}$, the source side unselected word lines $WL_{U\_S}$, the source side select gate line SGS, and the source line SL are applied with the voltage $V_{SS}$.

Third Embodiment

A first-mode write operation may also be applied to a write straddling the word lines WL. This case will be described below as the present embodiment.

First-Mode Write Operation

Next, a first-mode write operation according to the present embodiment will be described with reference to FIG. 20. In the first-mode write operation according to the present embodiment, too, a binary value (1 bit) is held in the plurality of memory cells MC.

Figure 20:
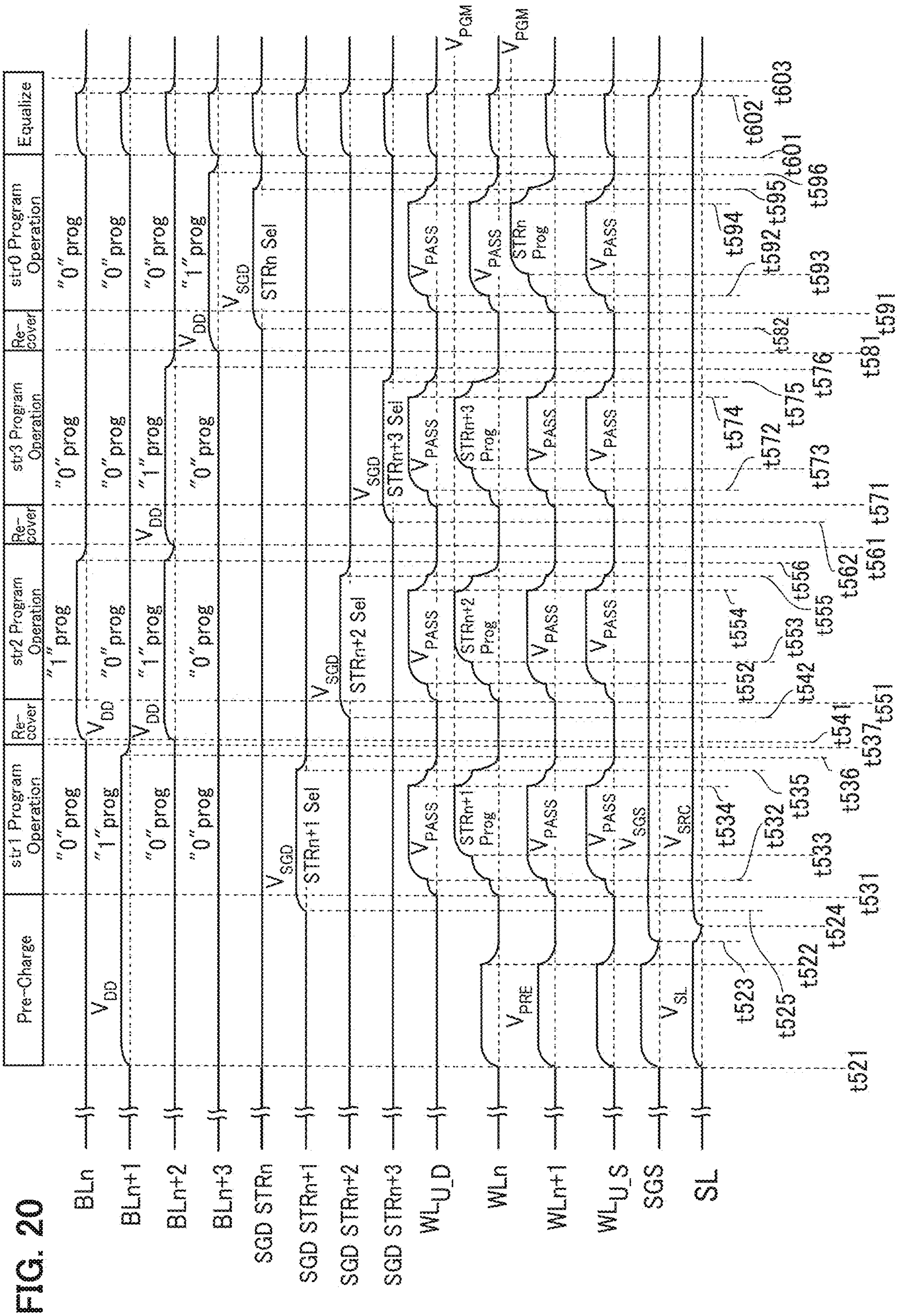
FIG. 20 is a timing chart for explaining a first-mode write operation according to a third embodiment.

FIG. 20 is a timing chart for explaining the first-mode write operation according to a third embodiment. The select gate lines SGD STRn, SGD STRn+1, SGD STRn+2, SGD STRn+3 of FIG. 20 are as described with reference to FIG. 19. A word line $WL_n$ and the word line $WL_{n+1}$ are the straddled word lines WL, and in the case where they represent a write target, indicate the selected word line $WL_S$. FIG. 20 shows the case where in the first pre-charge operation, the channel pre-charge operation is performed from the source side select gate line SGS side.

From timing t521 to timing t531, the first pre-charge operation in which target wirings are pre-charged by being applied with certain voltages, is executed.

At timing t521 of the first pre-charge operation, for example, the bit line $BL_n$, the bit line $BL_{n+2}$, and the bit line $BL_{n+3}$ that are to be the bit line $BL_W$ in the str1 program operation are applied with the voltage $V_{SS}$, the bit line $BL_{n+1}$ that is to be the bit line $BL_P$ in the str1 program operation is applied with the voltage $V_{DD}$, and the source line SL is applied with the voltage $V_{SL}$. Moreover, the word line $WL_n$, the word line $WL_{n+1}$, the source side unselected word lines $WL_{U\_S}$, and the source side select gate line SGS are applied with the voltage $V_{PRE}$, and the voltage $V_{SS}$ is raised to the voltage $V_{PRE}$. Note that the select gate lines SGD STRn, SGD STRn+1, SGD STRn+2, SGD STRn+3, and the drain side unselected word lines $WL_{U\_D}$ are applied with the voltage $V_{SS}$. Thus, the channel pre-charge operation is performed from the source side select gate line SGS side.

At timing t522 of the first pre-charge operation, the word line $WL_n$, the word line $WL_{n+1}$, the source side unselected word lines $WL_{U\_S}$, and the source side select gate line SGS are applied with the voltage $V_{SS}$, and the voltage $V_{PRE}$ is lowered to the voltage $V_{SS}$.

At timing t523 of the first pre-charge operation, the source line SL is applied with the voltage $V_{SS}$, and the voltage $V_{SL}$ is lowered to the voltage $V_{SS}$. Moreover, the source side select gate line SGS is applied with the voltage $V_{SGS}$, and the voltage $V_{SS}$ is raised to the voltage $V_{SGS}$. Note that at timing t523 of the first pre-charge operation, the source side select gate line SGS may continue to be applied with the voltage $V_{SS}$, unchanged.

At timing t524 of the first pre-charge operation, the source line SL is applied with the voltage $V_{SRC}$, and the voltage $V_{SS}$ is raised to the voltage $V_{SRC}$. Note that at timing t524 of the first pre-charge operation, the source line SL may continue to be applied with the voltage $V_{SS}$, unchanged.

At timing t525 of the first pre-charge operation, the select gate line SGD STRn+1 representing a target of write by the str1 program operation is applied with the voltage $V_{SGD}$.

From timing t531 to timing t537, the str1 program operation is executed.

At timing t531 of the str1 program operation, for example, the bit line $BL_{n+1}$ that is to be the bit line $BL_P$ in the str1 program operation is applied with the voltage $V_{DD}$ (the first voltage), the bit line $BL_n$, the bit line $BL_{n+3}$, and the bit line $BL_{n+3}$ that are to be the bit line $BL_W$ in the str1 program operation are applied with the voltage $V_{SS}$, and the select gate line SGD STRn+1 is applied with the voltage $V_{SGD}$. Moreover, at timing t531 of the str1 program operation, the drain side unselected word lines $WL_{U\_D}$, the word line $WL_n$, the word line $WL_{n+1}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t532 of the str1 program operation, the drain side unselected word lines $WL_{U\_D}$, the word line $WL_n$, the word line $WL_{n+1}$, and the source side unselected word lines $WL_{U\_S}$ are applied with the write pass voltage $V_{PASS}$.

At timing t533 of the str1 program operation, the word line $WL_n$ is applied with the str1 program voltage $V_{PGM}$.

At timing t534 of the str1 program operation, the word line $WL_n$ is applied with the write pass voltage $V_{PASS}$ and the str1 program voltage $V_{PGM}$ is lowered to the write pass voltage $V_{PASS}$, and the drain side unselected word lines $WL_{U\_D}$, the word line $WL_{n+1}$, and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t535 of the str1 program operation, the select gate line SGD STRn+1, the drain side unselected word lines $WL_{U\_D}$, the word line $WL_n$, the word line $WL_{n+1}$, and the source side unselected word lines $WL_{U\_S}$ are applied with the voltage $V_{SS}$, and the voltage $V_{SGD}$ Of the select gate line SGD STRn+1, the write pass voltage $V_{PASS}$ of the word line $WL_n$, and the voltage $V_{DD}$-$V_{th}$ of the word line $WL_{n+1}$, the drain side unselected word lines $WL_{U\_D}$, and the source side unselected word lines $WL_{U\_S}$ are lowered to the voltage $V_{SS}$.

At timing t536 of the str1 program operation, the bit line $BL_{n+1}$ is applied with the voltage $V_{SS}$, and the voltage $V_{DD}$ of the bit line $BL_{n+1}$ is lowered to the voltage $V_{SS}$.

From timing t537 to timing t551 after the str1 program operation and before the str2 program operation, the recovery operation is executed.

At timing t541 of the recovery operation, the bit line $BL_n$ and the bit line $BL_{n+2}$ that are to be the bit line $BL_P$ in the str2 program operation are applied with the voltage $V_{DD}$ as a recovery voltage.

At timing t542 of the recovery operation, the select gate line SGD STRn+2 representing a target of write by the str2 program operation is applied with the voltage $V_{SGD}$.

From timing t551 to timing t561, the str2 program operation is executed.

At timing t551 of the str2 program operation, for example, the bit line $BL_n$ and the bit line $BL_{n+2}$ that are to be the bit line $BL_P$ in the str2 program operation are applied with the voltage $V_{DD}$ (the first voltage), the bit line $BL_{n+1}$ and the bit line $BL_{n+3}$ that are to be the bit line $BL_W$ in the str2 program operation are applied with the voltage $V_{SS}$, and the select gate line SGD STRn+2 is applied with the voltage $V_{SGD}$. Moreover, at timing t551 of the str2 program operation, the drain side unselected word lines $WL_{U\_D}$, the word line $WL_n$, the word line $WL_{n+1}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t552 of the str2 program operation, the drain side unselected word lines $WL_{U\_D}$, the word line $WL_n$, the word line $WL_{n+1}$, and the source side unselected word lines $WL_{U\_S}$ are applied with the write pass voltage $V_{PASS}$.

At timing t553 of the str2 program operation, the word line $WL_n$ is applied with the str2 program voltage $V_{PGM}$.

At timing t554 of the str2 program operation, the word line $WL_n$ is applied with the write pass voltage $V_{PASS}$ and the str2 program voltage $V_{PGM}$ is lowered to the write pass voltage $V_{PASS}$, and the drain side unselected word lines $WL_{U\_D}$, the word line $WL_{n+1}$, and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t555 of the str2 program operation, the select gate line SGD STRn+2, the drain side unselected word lines $WL_{U\_D}$, the word line $WL_n$, the word line $WL_{n+1}$, and the source side unselected word lines $WL_{U\_S}$ are applied with the voltage $V_{SS}$, and the voltage $V_{SGD}$ of the select gate line SGD STRn+2, the write pass voltage $V_{PASS}$ of the word line $WL_n$, and the voltage $V_{DD}$-$V_{th}$ of the word line $WL_{n+1}$, the drain side unselected word lines $WL_{U\_D}$, and the source side unselected word lines $WL_{U\_S}$ are lowered to the voltage $V_{SS}$.

At timing t556 of the str2 program operation, the bit line $BL_n$ and the bit line $BL_{n+2}$ are applied with the voltage $V_{SS}$, and the voltage $V_{DD}$ of the bit line $BL_n$ and the bit line $BL_{n+2}$ is lowered to the voltage $V_{SS}$.

From timing t561 to timing t571 after the str2 program operation and before the str3 program operation, the recovery operation is executed.

At timing t561 of the recovery operation, the bit line $BL_{n+2}$ that is to be the bit line $BL_P$ in the str3 program operation is applied with the voltage $V_{DD}$ as a recovery voltage.

At timing t562 of the recovery operation, the select gate line SGD STRn+3 representing a target of write by the str3 program operation is applied with the voltage $V_{SGD}$.

From timing t571 to timing t581, the str3 program operation is executed.

At timing t571 of the str3 program operation, for example, the bit line $BL_{n+2}$ that is to be the bit line $BL_P$ in the str3 program operation is applied with the voltage VD (the first voltage), the bit line $BL_n$, bit line $BL_{n+1}$, and the bit line $BL_{n+3}$ that are to be the bit line $BL_W$ in the str3 program operation are applied with the voltage $V_{SS}$, and the select gate line SGD STRn+3 is applied with the voltage $V_{SGD}$. Moreover, at timing t571 of the str3 program operation, the drain side unselected word lines $WL_{U\_D}$, the word line $WL_n$, the word line $WL_{n+1}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t572 of the str3 program operation, the drain side unselected word lines $WL_{U\_D}$, the word line $WL_n$, the word line $WL_{n+1}$, and the source side unselected word lines $WL_{U\_S}$ are applied with the write pass voltage $V_{PASS}$.

At timing t573 of the str3 program operation, the word line $WL_n$ is applied with the str3 program voltage $V_{PGM}$.

At timing t574 of the str3 program operation, the word line $WL_n$ is applied with the write pass voltage $V_{PASS}$ and the str3 program voltage $V_{PGM}$ is lowered to the write pass voltage $V_{PASS}$, and the drain side unselected word lines $WL_{U\_D}$, the word line $WL_{n+1}$, and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t575 of the str3 program operation, the select gate line SGD STRn+3, the drain side unselected word lines $WL_{U\_D}$, the word line $WL_n$, the word line $WL_{n+1}$, and the source side unselected word lines $WL_{U\_S}$ are applied with the voltage $V_{SS}$, and the voltage $V_{SGD}$ of the select gate line SGD STRn+3, the write pass voltage $V_{PASS}$ of the word line $WL_n$, and the voltage $V_{DD}$-$V_{th}$ of the drain side unselected word lines $WL_{U\_D}$, the word line $WL_{n+1}$, and the source side unselected word lines $WL_{U\_S}$ are lowered to the voltage $V_{SS}$.

At timing t576 of the str3 program operation, the bit line $BL_{n+2}$ is applied with the voltage $V_{SS}$, and the voltage $V_{DD}$ of the bit line $BL_{n+2}$ is lowered to the voltage $V_{SS}$.

From timing t581 to timing t591 after the str3 program operation and before the str0 program operation, the recovery operation is executed.

At timing t581 of the recovery operation, the bit line $BL_{n+3}$ that is to be the bit line $BL_P$ in the str0 program operation is applied with the voltage $V_{DD}$ as a recovery voltage.

At timing t582 of the recovery operation, the select gate line SGD STRn representing a target of write by the str0 program operation is applied with the voltage $V_{SGD}$.

From timing t591 to timing t601, the str0 program operation is executed.

At timing t591 of the str0 program operation, for example, the bit line $BL_{n+3}$ that is to be the bit line $BL_P$ in the str0 program operation is applied with the voltage $V_{DD}$ (the first voltage), the bit line $BL_n$, the bit line $BL_{n+1}$, and the bit line $BL_{n+2}$ that are to be the bit line $BL_W$ in the str0 program operation are applied with the voltage $V_{SS}$, and the select gate line SGD STRn is applied with the voltage $V_{SGD}$. Moreover, at timing t591 of the str0 program operation, the drain side unselected word lines $WL_{U\_D}$, the word line $WL_n$, the word line $WL_{n+1}$, and the source side unselected word lines $WL_{U\_S}$ are applied with the voltage $V_{DD}$-$V_{th}$, and the voltage $V_{SS}$ is raised to the voltage $V_{DD}$-$V_{th}$.

At timing t592 of the str0 program operation, the drain side unselected word lines $WL_{U\_D}$, the word line $WL_n$, the word line $WL_{n+1}$, and the source side unselected word lines $WL_{U\_S}$ are applied with the write pass voltage $V_{PASS}$.

At timing t593 of the str0 program operation, the word line $WL_{n+1}$ is applied with the str0 program voltage $V_{PGM}$.

At timing t594 of the str0 program operation, the word line $WL_{n+1}$ is applied with the write pass voltage $V_{PASS}$ and the str0 program voltage $V_{PGM}$ is lowered to the write pass voltage $V_{PASS}$, and the drain side unselected word lines $WL_{U\_D}$, the word line $WL_n$, and the source side unselected word lines $WL_{U\_S}$ are applied with the voltage $V_{DD}$-$V_{th}$ and the write pass voltage $V_{PASS}$ is lowered to the voltage $V_{DD}$-$V_{th}$.

At timing t595 of the str0 program operation, the select gate line SGD STRn, the drain side unselected word lines $WL_{U\_D}$, the word line $WL_n$, the word line $WL_{n+1}$, and the source side unselected word lines $WL_{U\_S}$ are applied with the voltage $V_{SS}$, and the voltage $V_{SGD}$ of the select gate line SGD STRn, the write pass voltage $V_{PASS}$ of the word line $WL_{n+1}$, and the voltage $V_{DD}$-$V_{th}$ of the drain side unselected word lines $WL_{U\_D}$, the word line $WL_n$, and the source side unselected word lines $WL_{U\_S}$ are lowered to the voltage $V_{SS}$.

At timing t596 of the str0 program operation, the bit line $BL_{n+3}$ is applied with the voltage $V_{SS}$, and the voltage $V_{DD}$ of the bit line $BL_{n+3}$ is lowered to the voltage $V_{SS}$.

From timing t601 to timing t603 after the str0 program operation, the equalize operation (discharging) is executed.

At timing t601 of the equalize operation, the bit line $BL_n$ through the bit line $BL_{n+3}$, the select gate line SGD STRn through the select gate line SGD STRn+3, the drain side unselected word lines $WL_{U\_D}$, the word line $WL_n$, the word line $WL_{n+1}$, and the source side unselected word lines $WL_{U\_S}$ are applied with an open circuit voltage.

At timing t602 of the equalize operation, the bit line $BL_n$ through the bit line $BL_{n+3}$, the select gate line SGD STRn through the select gate line SGD STRn+3, the drain side unselected word lines $WL_{U\_D}$, the word line $WL_n$, the word line $WL_{n+1}$, the source side unselected word lines $WL_{U\_S}$, the source side select gate line SGS, and the source line SL are applied with the voltage $V_{SS}$.

Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a substrate;

a plurality of memory blocks arranged with the substrate in a first direction intersecting a surface of the substrate and arranged in a second direction intersecting the first direction; and a control circuit connected to the plurality of memory blocks, the control circuit executing a write operation, wherein the plurality of memory blocks each comprise:

a first drain side select transistor and a second drain side select transistor;

a first source side select transistor and a second source side select transistor;

a first memory cell transistor and a second memory cell transistor electrically connected in series between the first drain side select transistor and the first source side select transistor;

a third memory cell transistor and a fourth memory cell transistor electrically connected in series between the second drain side select transistor and the second source side select transistor;

a first bit line and a second bit line respectively electrically connected to the first drain side select transistor and the second drain side select transistor;

a first select gate line electrically connected to a gate electrode of the first drain side select transistor;

a second select gate line electrically connected to a gate electrode of the second drain side select transistor;

a third select gate line electrically connected to gate electrodes of the first source side select transistor and the second source side select transistor;

a source line electrically connected to the first source side select transistor and the second source side select transistor;

a first word line electrically connected to gate electrodes of the first memory cell transistor and the third memory cell transistor; and a second word line electrically connected to gate electrodes of the second memory cell transistor and the fourth memory cell transistor, the control circuit is configured capable of executing a first-mode write operation in which the control circuit sequentially executes a first pre-charge operation and a first program operation, and uninterruptedly thereafter executes a second program operation, the control circuit applies the first word line with a certain voltage in the first pre-charge operation, applies the first select gate line with a first voltage, applies the second select gate line with a second voltage smaller than the first voltage, applies the first word line with a first program voltage, and applies the second word line with a write pass voltage smaller than the first program voltage, in the first program operation, applies the first select gate line with the second voltage, applies the second select gate line with the first voltage, applies the first word line with a second program voltage larger than the write pass voltage, and applies the second word line with the write pass voltage, in the second program operation, and after applying of the first program voltage and before applying of the second program voltage, switches a voltage of the first select gate line from the first voltage to the second voltage, and switches a voltage of the second select gate line from the second voltage to the first voltage.

2. The semiconductor memory device according to claim 1, wherein the control circuit causes a binary value of data to be held in the first memory cell transistor and the third memory cell transistor, in the first program operation and the second program operation.

3. The semiconductor memory device according to claim 1, wherein the control circuit applies the first bit line with a first bit line voltage, and applies the second bit line with a second bit line voltage, in the first program operation, applies the first bit line with a third bit line voltage, and applies the second bit line with a fourth bit line voltage, in the second program operation, and after applying of the first program voltage and before applying of the second program voltage, switches a voltage of the first bit line from the first bit line voltage to the third bit line voltage, and switches a voltage of the second bit line from the second bit line voltage to the fourth bit line voltage.

4. The semiconductor memory device according to claim 3, wherein the first-mode write operation further includes an equalize operation executed after the second program operation, and the control circuit switches voltages of the first select gate line, the second select gate line, the first word line, and the second word line from the second voltage to a first open circuit voltage larger than the second voltage, in the equalize operation.

5. The semiconductor memory device according to claim 1, wherein the control circuit applies the first select gate line, the second select gate line, the first word line, the second word line, and the third select gate line with a third voltage larger than the second voltage, in the first pre-charge operation.

6. The semiconductor memory device according to claim 1, further comprising:

a fifth memory cell transistor provided between the first drain side select transistor and the first memory cell transistor;

a sixth memory cell transistor provided between the second drain side select transistor and the third memory cell transistor; and a third word line electrically connected to gate electrodes of the fifth memory cell transistor and the sixth memory cell transistor, wherein the second memory cell transistor is located between the first memory cell transistor and the first source side select transistor, the fourth memory cell transistor is located between the third memory cell transistor and the second source side select transistor, and the control circuit applies the first select gate line, the second select gate line, the first word line, and the third word line with a third voltage larger than the second voltage, in the first pre-charge operation.

7. The semiconductor memory device according to claim 1, further comprising:

a fifth memory cell transistor provided between the first drain side select transistor and the first memory cell transistor;

a sixth memory cell transistor provided between the second drain side select transistor and the third memory cell transistor; and a third word line electrically connected to gate electrodes of the fifth memory cell transistor and the sixth memory cell transistor, wherein the second memory cell transistor is located between the first memory cell transistor and the first source side select transistor, the fourth memory cell transistor is located between the third memory cell transistor and the second source side select transistor, and the control circuit applies the first word line, the second word line, and the third select gate line with a third voltage larger than the second voltage, in the first pre-charge operation.

8. The semiconductor memory device according to claim 1, wherein the control circuit is configured capable of further executing a second-mode write operation in which the control circuit sequentially executes the first pre-charge operation and the first program operation, and thereafter sequentially executes a second pre-charge operation and the second program operation, and the control circuit applies the first word line with a certain voltage in the second pre-charge operation.

9. The semiconductor memory device according to claim 1, wherein the first-mode write operation further includes a first verify operation and a second verify operation that are executed later than the second program operation, and the control circuit applies the first select gate line and the third select gate line with a fourth voltage larger than the first voltage, applies the second select gate line with the second voltage, and applies the first word line with a first verify voltage smaller than the fourth voltage, in the first verify operation, and applies the second select gate line and the third select gate line with the fourth voltage, applies the first select gate line with the second voltage, and applies the first word line with the first verify voltage, in the second verify operation.

10. The semiconductor memory device according to claim 1, wherein the memory block comprises:

a plurality of conductive layers arranged in the first direction;

a semiconductor column extending in the first direction and facing the plurality of conductive layers; and an electric charge accumulating film provided between the plurality of conductive layers and the semiconductor column, one of the plurality of conductive layers functions as the first word line, and another one of the plurality of conductive layers functions as the second word line.

11. A method of controlling a semiconductor memory device, the semiconductor memory device comprising:

a substrate;

a plurality of memory blocks arranged with the substrate in a first direction intersecting a surface of the substrate and arranged in a second direction intersecting the first direction; and a control circuit connected to the plurality of memory blocks, the control circuit executing a write operation, the plurality of memory blocks each comprising:

a first drain side select transistor and a second drain side select transistor;

a first source side select transistor and a second source side select transistor;

a first memory cell transistor and a second memory cell transistor electrically connected in series between the first drain side select transistor and the first source side select transistor;

a third memory cell transistor and a fourth memory cell transistor electrically connected in series between the second drain side select transistor and the second source side select transistor;

a first bit line and a second bit line respectively electrically connected to the first drain side select transistor and the second drain side select transistor;

a first select gate line electrically connected to a gate electrode of the first drain side select transistor;

a second select gate line electrically connected to a gate electrode of the second drain side select transistor;

a third select gate line electrically connected to gate electrodes of the first source side select transistor and the second source side select transistor;

a source line electrically connected to the first source side select transistor and the second source side select transistor;

a first word line electrically connected to gate electrodes of the first memory cell transistor and the third memory cell transistor; and a second word line electrically connected to gate electrodes of the second memory cell transistor and the fourth memory cell transistor, wherein in the method of controlling a semiconductor memory device, the control circuit performs a first-mode write operation in which a first pre-charge operation and a first program operation are sequentially executed, and uninterruptedly thereafter, a second program operation is executed, the first word line is applied with a certain voltage in the first pre-charge operation, the first select gate line is applied with a first voltage, the second select gate line is applied with a second voltage smaller than the first voltage, the first word line is applied with a first program voltage, and the second word line is applied with a write pass voltage smaller than the first program voltage, in the first program operation, the first select gate line is applied with the second voltage, the second select gate line is applied with the first voltage, the first word line is applied with a second program voltage larger than the write pass voltage, and the second word line is applied with the write pass voltage, in the second program operation, and after applying of the first program voltage and before applying of the second program voltage, a voltage of the first select gate line is switched from the first voltage to the second voltage, and a voltage of the second select gate line is switched from the second voltage to the first voltage.

12. The method of controlling a semiconductor memory device according to claim 11, wherein a binary value of data is caused to be held in the first memory cell transistor and the third memory cell transistor, in the first program operation and the second program operation.

13. The method of controlling a semiconductor memory device according to claim 11, wherein the semiconductor memory device further comprises:

a fifth memory cell transistor provided between the first drain side select transistor and the first memory cell transistor;

a sixth memory cell transistor provided between the second drain side select transistor and the third memory cell transistor; and a third word line electrically connected to gate electrodes of the fifth memory cell transistor and the sixth memory cell transistor, the second memory cell transistor is located between the first memory cell transistor and the first source side select transistor, the fourth memory cell transistor is located between the third memory cell transistor and the second source side select transistor, and the first select gate line, the second select gate line, the first word line, and the third word line are applied with a third voltage larger than the second voltage, in the first pre-charge operation.

14. The method of controlling a semiconductor memory device according to claim 11, wherein the semiconductor memory device further comprises:

a fifth memory cell transistor provided between the first drain side select transistor and the first memory cell transistor;

a sixth memory cell transistor provided between the second drain side select transistor and the third memory cell transistor; and a third word line electrically connected to gate electrodes of the fifth memory cell transistor and the sixth memory cell transistor, the second memory cell transistor is located between the first memory cell transistor and the first source side select transistor, the fourth memory cell transistor is located between the third memory cell transistor and the second source side select transistor, and the first word line, the second word line, and the third select gate line are applied with a third voltage larger than the second voltage, in the first pre-charge operation.

15. The method of controlling a semiconductor memory device according to claim 11, wherein the control circuit is configured to further perform a second-mode write operation in which the first pre-charge operation and the first program operation are sequentially executed, and thereafter, a second pre-charge operation and the second program operation are sequentially executed, and the first word line is applied with a certain voltage in the second pre-charge operation.

16. The method of controlling a semiconductor memory device according to claim 11, wherein the first-mode write operation further includes a first verify operation and a second verify operation that are executed later than the second program operation, the first select gate line and the third select gate line are applied with a fourth voltage larger than the first voltage, the second select gate line is applied with the second voltage, and the first word line is applied with a first verify voltage smaller than the fourth voltage, in the first verify operation, and the second select gate line and the third select gate line are applied with the fourth voltage, the first select gate line is applied with the second voltage, and the first word line is applied with the first verify voltage, in the second verify operation.

17. The method of controlling a semiconductor memory device according to claim 11, wherein the memory block comprises:

a plurality of conductive layers arranged in the first direction;

a semiconductor column extending in the first direction and facing the plurality of conductive layers; and an electric charge accumulating film provided between the plurality of conductive layers and the semiconductor column, one of the plurality of conductive layers functions as the first word line, and another one of the plurality of conductive layers functions as the second word line.

18. The method of controlling a semiconductor memory device according to claim 11, wherein the first bit line is applied with a first bit line voltage, and the second bit line is applied with a second bit line voltage, in the first program operation, the first bit line is applied with a third bit line voltage, and the second bit line is applied with a fourth bit line voltage, in the second program operation, and after applying of the first program voltage and before applying of the second program voltage, a voltage of the first bit line is switched from the first bit line voltage to the third bit line voltage, and a voltage of the second bit line is switched from the second bit line voltage to the fourth bit line voltage.

19. The method of controlling a semiconductor memory device according to claim 18, wherein the first-mode write operation further includes an equalize operation executed after the second program operation, and voltages of the first select gate line, the second select gate line, the first word line, and the second word line are switched from the second voltage to a first open circuit voltage larger than the second voltage, in the equalize operation.

20. The method of controlling a semiconductor memory device according to claim 11, wherein the first select gate line, the second select gate line, the first word line, the second word line, and the third select gate line are applied with a third voltage larger than the second voltage, in the first pre-charge operation.

* * * * *